(12) United States Patent
Sato et al.

(10) Patent No.: US 6,808,860 B2
(45) Date of Patent: Oct. 26, 2004

(54) POSITIVE PHOTORESIST COMPOSITION

(75) Inventors: Kenichiro Sato, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 63 days.

(21) Appl. No.: 09/834,639

(22) Filed: Apr. 16, 2001

(65) Prior Publication Data

US 2002/0009666 A1 Jan. 24, 2002

(30) Foreign Application Priority Data

| | | |
|---|---|---|
| Apr. 17, 2000 | (JP) | P.2000-115497 |
| Jul. 17, 2000 | (JP) | P.2000-215574 |
| Jul. 31, 2000 | (JP) | P.2000-231670 |

(51) Int. Cl.$^7$ .............................................. G03F 7/004
(52) U.S. Cl. ..................... 430/270.1; 430/905; 526/281
(58) Field of Search ............................ 430/270.1, 905; 526/581, 281

(56) References Cited

U.S. PATENT DOCUMENTS

| | | | | |
|---|---|---|---|---|
| 5,478,869 | A | * 12/1995 | Takahashi et al. | 522/77 |
| 6,280,898 | B1 | * 8/2001 | Hasegawa et al. | 430/270.1 |
| 6,284,429 | B1 | * 9/2001 | Kinsho et al. | 430/270.1 |
| 6,448,420 | B1 | * 9/2002 | Kinsho et al. | 552/549 |
| 6,579,659 | B2 | * 6/2003 | Uetani et al. | 430/270.1 |
| 2001/0010890 | A1 | * 8/2001 | Hatakeyama et al. | 430/270.1 |
| 2001/0018162 | A1 | * 8/2001 | Hatakeyama et al. | 430/270.1 |
| 2001/0033989 | A1 | * 10/2001 | Harada et al. | 430/270.1 |
| 2001/0038969 | A1 | * 11/2001 | Hatakeyama et al. | 430/270.1 |
| 2001/0044070 | A1 | 11/2001 | Uetani et al. | |
| 2002/0009668 | A1 | * 1/2002 | Nishimura et al. | 430/270.1 |
| 2002/0015913 | A1 | 2/2002 | Uetani et al. | |
| 2002/0048724 | A1 | * 4/2002 | Harada et al. | 430/270.1 |
| 2002/0051935 | A1 | * 5/2002 | Hatakeyama et al. | 430/270.1 |
| 2002/0051936 | A1 | * 5/2002 | Harada et al. | 430/270.1 |
| 2002/0058201 | A1 | * 5/2002 | Miyaji et al. | 430/270.1 |
| 2002/0061465 | A1 | * 5/2002 | Hasegawa et al. | 430/270.1 |
| 2002/0132181 | A1 | * 9/2002 | Nishimura et al. | 430/270.1 |

FOREIGN PATENT DOCUMENTS

| | | | |
|---|---|---|---|
| JP | 10-10739 | 1/1998 | ........... G03F/7/039 |
| JP | 10-130340 | 5/1998 | ......... C08F/232/08 |
| JP | 11-305444 A | 11/1999 | |
| JP | 2000-26446 | 1/2000 | ......... C07D/307/77 |
| JP | 2000-159758 A | 6/2000 | |
| JP | 2001-142213 A | 5/2001 | |
| JP | 2001-188346 A | 7/2001 | |
| JP | 2001-240625 A | 9/2001 | |
| JP | 2002-116546 A | 4/2002 | |
| JP | 2002-131917 A | 5/2002 | |
| JP | 2002-296783 A | 10/2002 | |

* cited by examiner

Primary Examiner—Yvette C. Thornton
(74) Attorney, Agent, or Firm—Sughrue Mion, PLLC

(57) ABSTRACT

Provided is a positive photoresist composition comprising a resin which contains specific repeating units and whose dissolving rate toward an alkaline developing solution is increased by the action of an acid and a compound which generates an acid upon irradiation with an actinic ray or a radiation.

10 Claims, No Drawings

POSITIVE PHOTORESIST COMPOSITION

FIELD OF INVENTION

The present invention relates to a positive photoresist composition used in an ultramicrolithography process, e.g., for the production of VLSI and high capacity microchips, or other photofabrication processes. More specifically, the invention relates to a positive photoresist composition exhibiting satisfactory exposure margin and edge roughness.

BACKGROUND OF THE INVENTION

Recently, the degree of integration of integrated circuits is becoming much higher, and the processing for superfine patterns having a line width of half micron or less is beginning to be required in the production of semiconductor substrates for VLSI and the like. In order to meet such a requirement, the wavelengths used in an exposure apparatus for photolithography are becoming shorter, and nowadays the use of far ultraviolet light having shorter wavelength, excimer laser beams (XeCl, KrF, ArF, etc.), is being investigated.

On of the resists for use in this wavelength region is a chemically amplified resist.

In general, the chemically amplified resist is roughly divided into three types, the so-called two-component, two point five-component and three-component types. The chemically amplified resist of two-component type is a combination of a compound which generates an acid by photolysis (hereinafter, referred to as a "photo-acid generator") with a binder resin. The binder resin is a resin which has, in a molecule, a group capable of being decomposed by the action of an acid to increase the solubility of resin in an alkaline developing solution (which are sometimes referred to as "acid-decomposable group"). The resist of two point five-component type further contains a low molecular weight compound having an acid-decomposable group in addition to the above two components. The resist of three-component type contains a photo-acid generator, an alkali-soluble resin and the above low molecular weight compound.

The chemically amplified resist is a photoresist suitable for exposure to ultraviolet light or far ultraviolet light. Further, it is necessary for the resist to satisfy the required characteristics in the practical use. As photoresist compositions for the ArF excimer light source, the combinations of (meth)acrylic resins showing less absorption of light than partially hydroxylated styrene resins with compounds which generate acids upon exposure are proposed in, e.g., JP-A-7-199467 and JP-A-7-252324 (the term "JP-A" as used herein means an "unexamined published Japanese patent application"). Specifically, JP-A-6-289615 discloses a resin whose oxygen atom of the carboxyl group of the acrylic acid is bonded to a tertiary carbon-organic group through ester linkages.

Further, JP-A-7-234511 discloses an acid-decomposable resin containing acrylate esters and fumarate esters as repeating units. However, those resins only provide insufficient pattern profile and adhesiveness to a substrate and thus, they are not successful in ensuring satisfactory performances.

Furthermore, a resin where an alicyclic hydrocarbon moiety is introduced for the purpose of imparting dry etching resistance is proposed.

JP-A-9-73173, JP-A-9-90637, and JP-A-10-161313 describe resist materials which comprises acid-sensitive compounds containing alkali-soluble groups protected by alicyclic group-containing structures and structural units making the alkali-soluble groups alkali-soluble through the elimination of the alkali-soluble groups by an acid.

Moreover, JP-A-9-90637, JP-A-10-207069, and JP-A-10-274852 describe resist compositions containing acid-decomposable resins having specific lactone structures.

In the lithography process for device production where the wavelength of an irradiation for exposure lies in conventional UV or deep UV region, i.e., from about 240 nm to about 370 nm, resist materials containing polymers having ethylenic or aromatic unsaturation are generally use.

However, such resist materials are mostly unsuitable for the process of exposure with an irradiation of 193 nm. The reason is that a carbon-carbon double bond absorbs the irradiation of this wavelength. As a result, the resist materials used in the lithography process where the wavelength of an irradiation for exposure is 248 nm or higher cannot be used in the process where an irradiation for exposure having a wavelength of 193 nm is used.

Since the lithography process for producing devices under a design rule of 0.18 $\mu$m and 0.13 $\mu$m or less uses a light having a wavelength of 193 nm as the irradiation for exposure, a resist polymer containing little ethylenic unsaturation is desired. The materials described in JP-A-10-10739 and JP-A-10-307401 have improved transparency toward a light having a wavelength of 193 nm but is not so highly sensitive, and they are unsatisfactory in performance as resists for the lithography for use in design rule of 0.13 $\mu$m or less, for example, insufficient resolving power.

JP-A-10-130340 discloses a chemically amplified resist containing a terpolymer having a specific repeating unit with a norbornene structure at the main chain.

Further, JP-A-2000-26446 provides a resist for ArF exposure having an excellent resolution by use of a polymer containing a (meth)acrylate having a lactone structure as the repeating unit.

Furthermore, an attempt to improve transparency toward a light having a short wavelength, dry etching resistance and resolution by use of a resin having a bridged alicyclic skeleton where at least one carbon atom is bonded to an oxygen atom through a double bond is described in JP-A-2000-122294.

However, such chemically amplified resists have possessed problems of line edge roughness and occurrence of defects at developing. The line edge roughness means that an edge at a substrate interface shows unevenness at overhead view of a pattern because a line pattern of the resist and the edge moves irregularly in the perpendicular direction against the line direction owing to the characteristic property of the resist. This unevenness causes inhibition of pattern resolving power and deterioration of electric property through transcription in etching process where the resist is used as the mask, and therefore, the process yield is lowered. In particular, as the size of resist pattern decreases to quarter micron or less, the demand for improving line edge roughness has been increasing but the guideline for the improvement has hardly been disclosed.

Further, there also exists a necessity for improving exposure margin. The exposure margin herein means a phenomenon of changing the line width of the resulting pattern with the change of light exposure.

SUMMARY OF THE INVENTION

Accordingly, an object of the invention is to provide a positive photoresist composition exhibiting reduced line edge roughness and occurrence of developing defects.

Another object of the invention is to provide a positive photoresist composition exhibiting an improving effect on exposure margin, especially exposure margin of an isolated line, i.e., small variation of line width of an isolated line when light exposure is changed.

As a result of the extensive studies of constituent materials for positive resist compositions of chemically amplified type, the present inventors have found that the above objects of the invention can be attained by use of an acid-decomposable resin having a repeating unit having a particular structure, thereby achieving the present invention.

Namely, the above objects are attained by the following constitutions.

(1) A positive photoresist composition comprising:

(A) a resin which contains a repeating unit represented by the following general formula (I) and a repeating unit represented by the following general formula (II), and whose dissolving rate toward an alkaline developing solution is increased by the action of an acid, and (B) a compound which generates an acid upon irradiation with an actinic ray or a radiation,

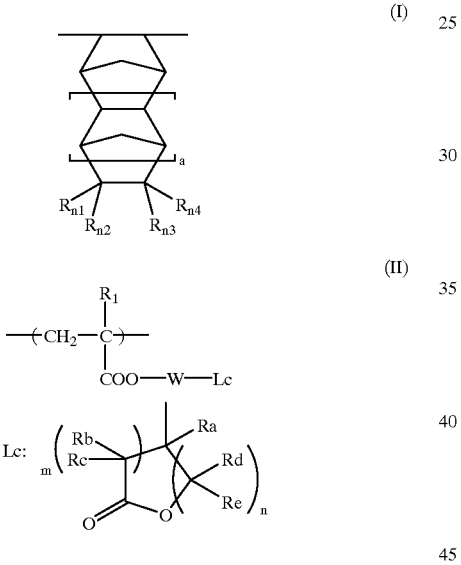

wherein in the formula (I), $Rn_1$ to $Rn_4$ each represents a hydrogen atom or an alkyl group which may have one or more substituents, and a is 0 or 1; and in the formula (II), $R_1$ represents a hydrogen atom or a methyl group, W represents one group or a combination of two or more groups each selected from the group consisting of a single bond, an alkylene group, an ether group, a thioether group, a carbonyl group, and an ester group, Ra, Rb, Rc, Rd, and Rd each independently represents hydrogen atom or an alkyl group having 1 to 4 carbon atoms, m and n each independently represents an integer of 0 to 3, and m+n is from 2 to 6.

(2) A positive photoresist composition comprising:

(A1) a resin which contains a repeating unit represented by the following general formula (I), a repeating unit represented by the following general formula (NII) and a repeating unit having a group represented by any of the following general formulae (I-1) to (I-4), and whose dissolving rate toward an alkaline developing solution is increased by the action of an acid, and (B) a compound which generates an acid upon irradiation with an actinic ray or a radiation,

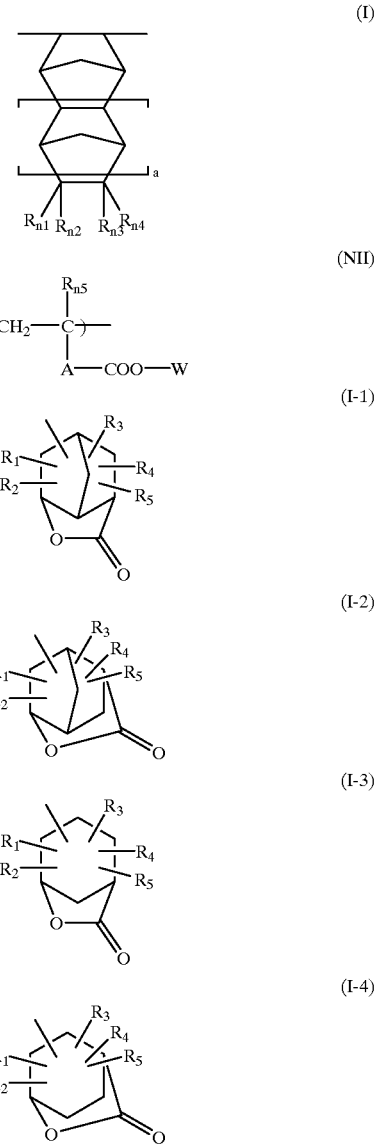

wherein in the formula (I), $Rn_1$ to $Rn_4$ each represents a hydrogen atom or an alkyl group which may have one or more substituents, and a is 0 or 1;

in the formula (NII), $Rn_5$ represents a hydrogen atom or a methyl group; A represents one group or a combination of two or more groups each selected from the group consisting of a single bond, an alkylene group, a cycloalkylene group, an ether group, a thioether group, a carbonyl group and an ester group; W represents a group represented by —C(Rna)(Rnb)(Rnc) or a group represented by —CH(Rnd)—O—Rne, wherein Rna, Rnb, and Rnc each represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent, provided that Rna and Rnb may be bonded to each other to form an alicyclic ring together with the carbon atom to which the groups are commonly attached and, in this case, Rnc is an alkyl group having 1 to 4 carbon atoms, Rnd represents a hydrogen atom or an alkyl group, Rne represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent;

In the general formulae (I-1) to (1-4), $R_1$ to $R_5$ may be the same or different, and each represents a hydrogen atom, or an alkyl group, a cycloalkyl group or an alkenyl group which may have one or more substituents, and two of $R_1$ to $R_5$ may be bonded to each other to form a ring.

(3) A positive photoresist composition comprising:

(A2) a resin which contains a repeating unit represented by the following general formula (I), a repeating unit represented by the following general formula (NII) and a repeating unit represented by the following general formula (I'), and whose dissolving rate toward an alkaline developing solution is increased by the action of an acid, and (B) a compound which generates an acid upon irradiation with an actinic ray or a radiation,

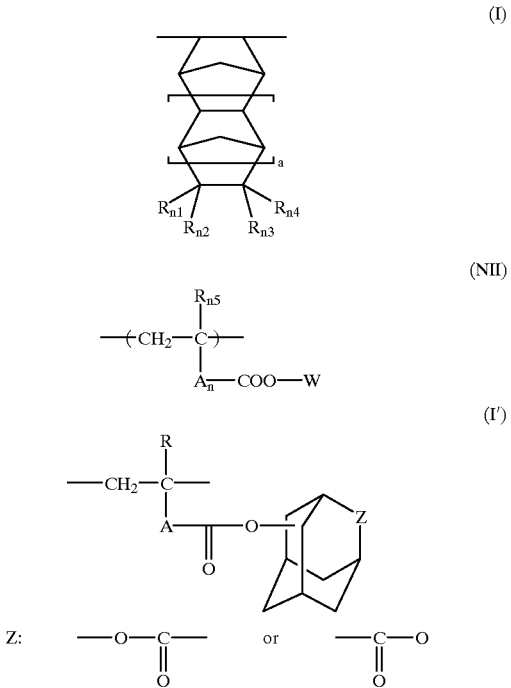

wherein in the formula (I), $Rn_1$ to $Rn_4$ each represents a hydrogen atom or an alkyl group which may have one or more substituents, and a is 0 or 1;

in the formula (NII), $Rn_5$ represents a hydrogen atom or a methyl group; An represents one group or a combination of two or more groups each selected from the group consisting of a single bond, an alkylene group, a cycloalkylene group, an ether group, a thioether group, a carbonyl group and an ester group; W represents a group represented by —C(Rna)(Rnb)(Rnc) or a group represented by —CH(Rnd)—O—Rne, wherein Rna, Rnb, and Rnc each represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent, provided that Rna and Rnb may be bonded to each other to form an alicyclic ring together with the carbon atom to which the groups are commonly attached and, in this case, Rnc is an alkyl group having 1 to 4 carbon atoms, Rnd represents a hydrogen atom or an alkyl group, Rne represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent; and in the general formulae (I'), A represents one group or a combination of two or more groups each selected from the group consisting of a single bond, an alkylene group, a cycloalkylene group, an ether group, a thioether group, a carbonyl group and an ester group, and R represents a hydrogen atom, an alkyl group having 1 to 4 carbon atoms, a cyano group or a halogen atom.

(4) The positive photoresist as described in the above (1), (2) or (3), wherein the above resin (A), (A1) or (A2) further contains a repeating unit represented by the following general formula (NIII),

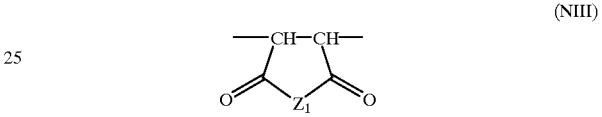

wherein $Z_1$ represents —O— or —N(Rn$_6$)—, wherein Rn$_6$ represents a hydrogen atom, an alkyl group, a haloalkyl group, a hydroxyl group or —OSO$_2$—Rn$_7$, and Rn, represents an alkyl group, a haloalkyl group, a cycloalkyl group or a camphor residue.

(5) The positive photoresist as described in the above (1), (2) or (3), which further comprises (C) an organic basic compound and (D) a fluorine-type and/or silicon-type surfactant.

DETAILED DESCRIPTION OF THE INVENTION

The following will explain the components for use in the invention in detail.

[1] (A), (A1) and (A2) the Resin Whose Dissolving Rate toward an Alkaline Developing Solution is Increased by the Action of an Acid (Hereinafter, Sometimes Referred to as "Acid-decomposable Resin")

In the formula (I) which represents a repeating unit of the acid-decomposable resin, $Rn_1$ to $Rn_4$ each represents a hydrogen atom or an alkyl group which may have substituent(s).

The alkyl group of $Rn_1$ to $Rn_4$ is preferably an alkyl group having 1 to 12 carbon atoms, more preferably an alkyl group having 1 to 10 carbon atoms. Specifically, preferred examples include methyl group, ethyl group, propyl group, isopropyl group, n-butyl group, isobutyl group, sec-butyl group, t-butyl group, pentyl group, hexyl group, heptyl group, octyl group, nonyl group, and decyl group. Examples of the substituent of the alkyl group include hydroxyl group, alkoxy group, and alkoxyalkoxy group.

In the formula (I), a is 0 or 1.

The following shows specific examples of the monomer corresponding to the repeating unit represented by the general formula (I), but it should not be construed as being limited thereto.

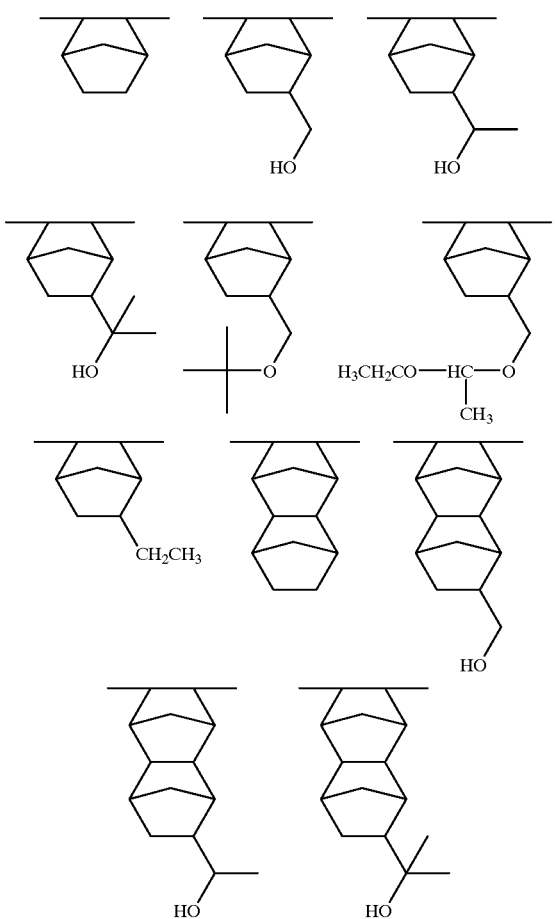

In the general formula (II) in (A), the alkylene group represented by W may be the groups represented by the following formula:

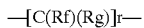
—[C(Rf)(Rg)]r—

In the above formula, Rf and Rg, which may be the same or different, each represents a hydrogen atom, an alkyl group, a substituted alkyl group, a halogen atom, a hydroxyl group or an alkoxy group. The alkyl group is preferably a lower alkyl group such as methyl group, ethyl group, ethyl group, isopropyl group, or butyl group, and is more preferably selected from methyl group, ethyl group, propyl group, and isopropyl group. The substituent of the substituted alkyl group includes hydroxyl group, a halogen atom, and alkoxy group. The alkoxy group includes those containing 1 to 4 carbon atoms such as methoxy group, ethoxy group, propoxy group and butoxy group. The halogen atom includes chlorine atom, bromine atom, fluorine atom and iodine atom. r represents an integer of 1 to 10.

Examples of the further substituent of the above alkyl group include carboxyl group, an acyloxy group, cyano group, an alkyl group, a substituted alkyl group, a halogen atom, a hydroxy group, an alkoxy group, a substituted alkoxy group, an acetylamide group, an alkoxycarbonyl group, and an acyl group.

The alkyl group includes lower alkyl groups such as methyl group, ethyl group, propyl group, isopropyl group, butyl group, cyclopropyl group, cyclobutyl group, and cyclopentyl group. The substituent of the substituted alkyl group includes hydroxyl group, a halogen atom, alkoxy group, and the like. The substituent of the substituted alkoxy group includes alkoxy groups. The alkoxy group includes those containing 1 to 4 carbon atoms such as methoxy group, ethoxy group, propoxy group and butoxy group. The acyloxy group includes acetoxy group and the like. The halogen atom includes chlorine atom, bromine atom, fluorine atom and iodine atom.

The following shows specific examples of the monomer corresponding to the repeating unit represented by the general formula (II), but it should not be construed as being limited thereto.

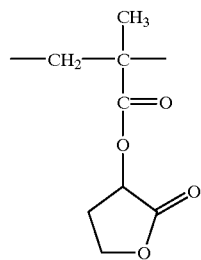
(II-1)

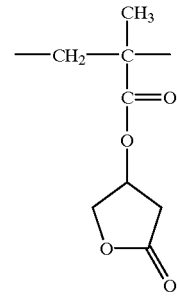
(II-2)

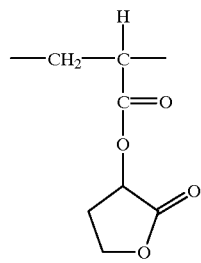
(II-3)

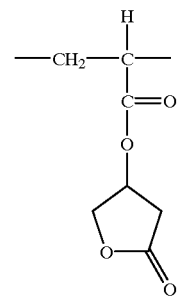
(II-4)

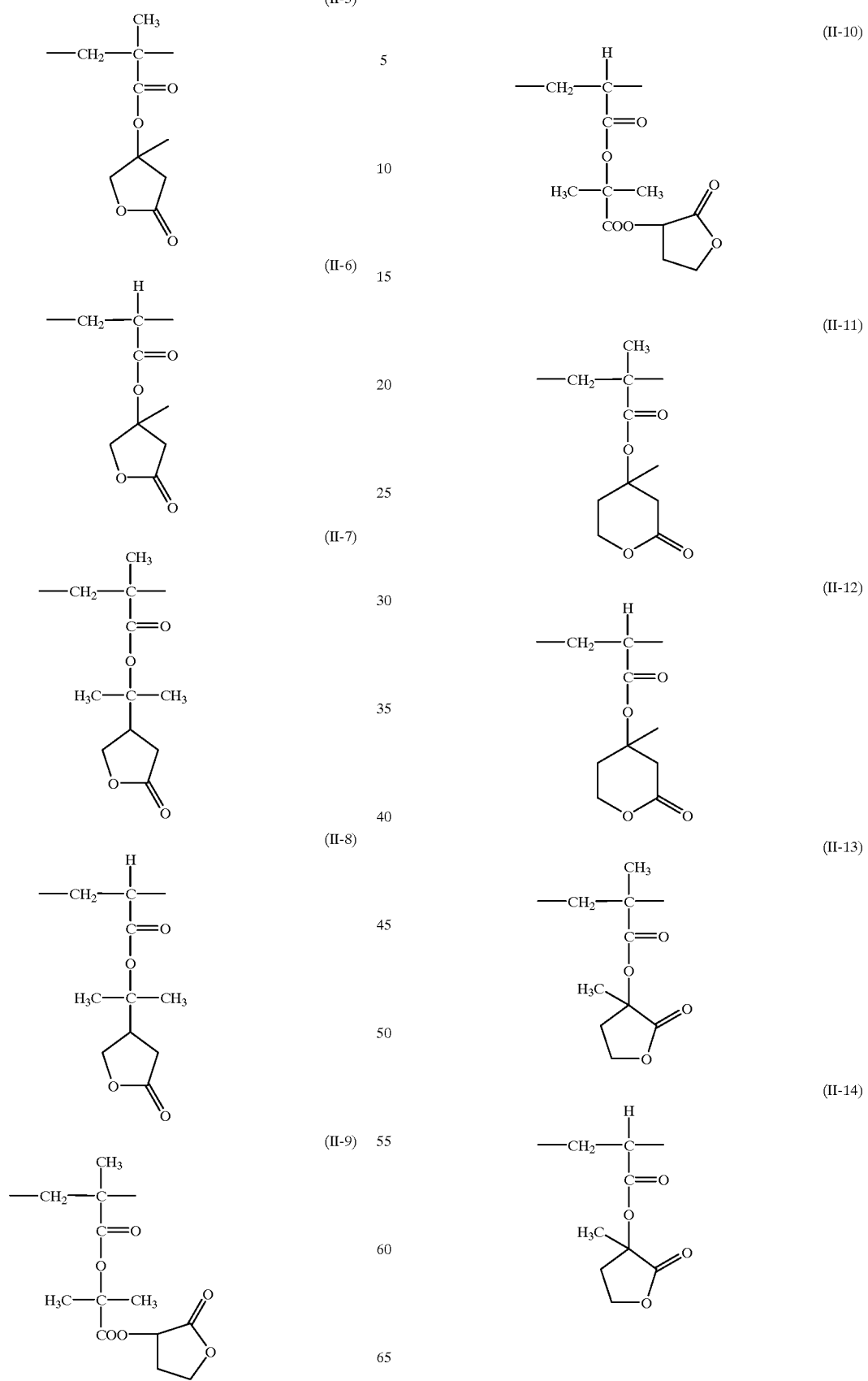

(II-15) 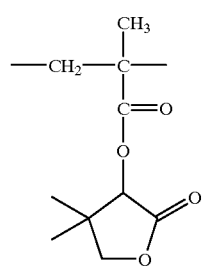
(II-16) 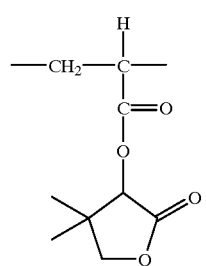
(II-17) 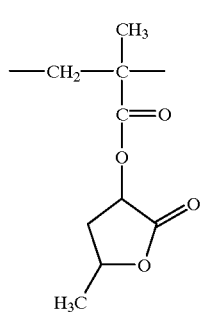
(II-18) 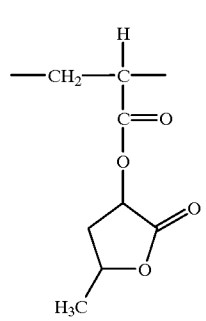
(II-19) 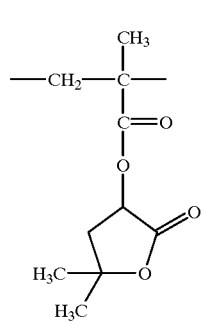
(II-20) 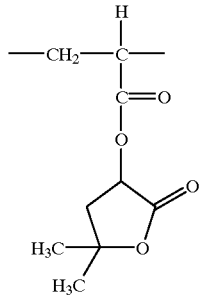
(II-21) 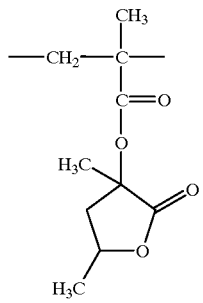
(II-22) 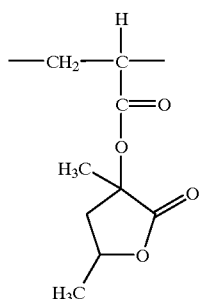
(II-23) 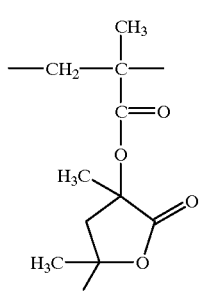
(II-24) 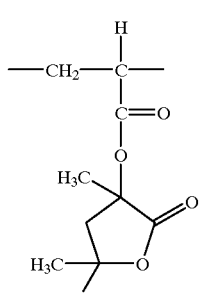

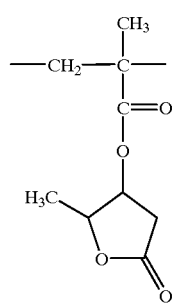
(II-25)
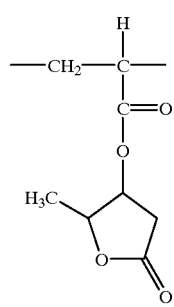
(II-26)
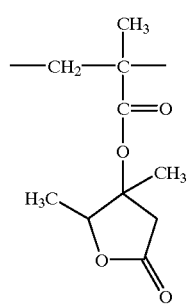
(II-27)
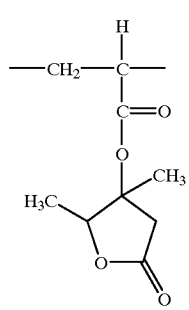
(II-28)
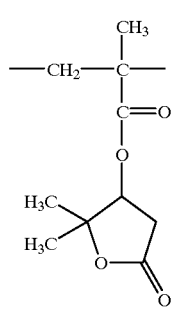
(II-29)
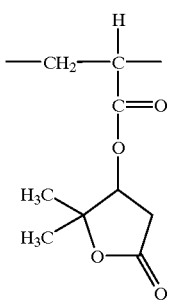
(II-30)
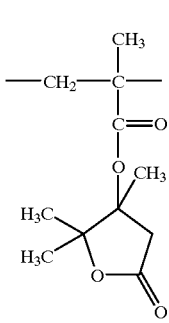
(II-31)
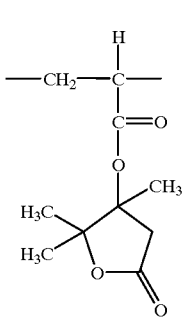
(II-32)
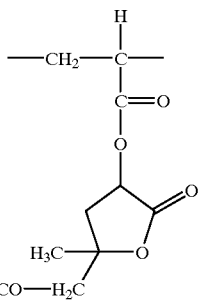
(II-33)
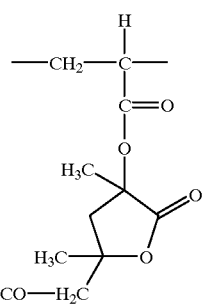
(II-34)

(II-35)

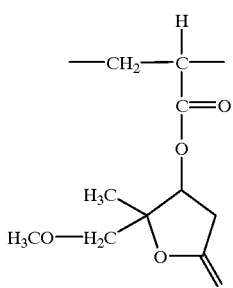

(II-36)

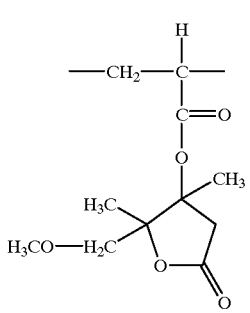

In the above specific examples of the general formula (II), (II-17) to (II-36) are preferred in view of more satisfactory exposure margin.

Further, as the structure of the general formula (II), those having an acrylate structure are preferred in view of exhibiting satisfactory edge roughness.

In the general formula (NII) which represents a repeating unit in the acid-decomposable resin (Al), $Rn_5$ represents hydrogen atom or methyl group.

In the general formula (NII), the alkylene group represented by A may be the groups represented by the following formula:

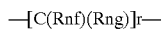

—[C(Rnf)(Rng)]r—

In the above formula, Rnf and Rng, which may be the same or different, each represents hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group, or butyl group, and is more preferably selected from methyl group, ethyl group, propyl group, and isopropyl group. The substituent of the substituted alkyl group include a hydroxyl group, a halogen atom, and an alkoxy group. The alkoxy group includes those containing 1 to 4 carbon atoms such as methoxy group, ethoxy group, propoxy group and butoxy group. The halogen atom includes chlorine atom, bromine atom, fluorine atom and iodine atom. r represents an integer of 1 to 10.

In the general formula (NII), the cycloalkylene group represented by A may be those having 3 to 10 carbon atoms, and includes cyclopentylene group, cyclohexylene group, cyclooctylene group and the like.

W in the general formula (NII) is a group which constitutes an acid-decomposable group together with an ester structure (—COO—), and represents a group represented by —C(Rna)(Rnb)(Rnc) or a group represented by —CH(Rnd)—O—Rne, wherein Rna, Rnb, and Rnc each represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent, provided that Rna and Rnb may be bonded to each other to form an alicyclic ring together with the carbon atom to which the groups are commonly attached and, in this case, Rnc is an alkyl group having 1 to 4 carbon atoms. Rnd represents a hydrogen atom or an alkyl group. Rne represents a linear or branched alkyl group having 1 to 20 carbon atoms or an alicyclic hydrocarbon group which may have a halogen atom, an alkoxy group, an alkoxycarbonyl group, an acyl group or an acyloxy group as a substituent.

The linear or branched alkyl group having 1 to 20 carbon atoms of Rna, Rnb, Rnc or Rne is preferably those having 1 to 12 carbon atoms, more preferably 1 to 10 carbon atoms and specifically, preferred examples include methyl group, ethyl group, propyl group, isopropyl group, n-butyl group, isobutyl group, sec-butyl group, t-butyl group, pentyl group, hexyl group, heptyl group, octyl group, nonyl group, and decyl group. The alkyl group for Rnd is preferably an alkyl group having 1 to 4 carbon atoms and examples include methyl group, ethyl group, propyl group, isopropyl group, n-butyl group, isobutyl group, sec-butyl group, and t-butyl group.

The alicyclic hydrocarbon group of Rna, Rnb, Rnc or Rne and the alicyclic ring to be formed by the bonding of Rna and Rnb each other may preferably have 3 to 30 carbon atoms, more preferably 4 to 25, particularly preferably 5 to 20. These may have substituent(s).

The following will show structural examples of these alicyclic rings.

(1)

(2)

(3)

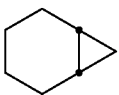

(4)

(5)

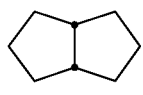

(6)

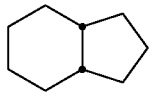

(7)

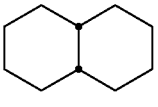

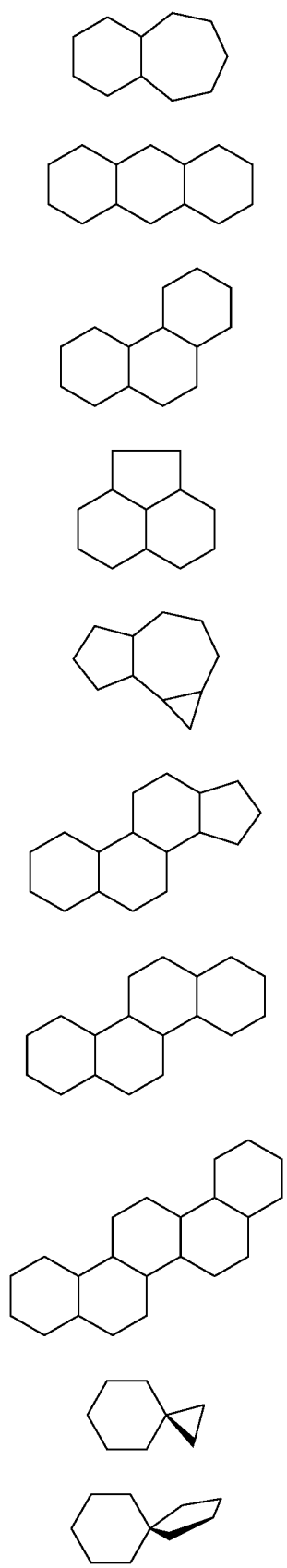
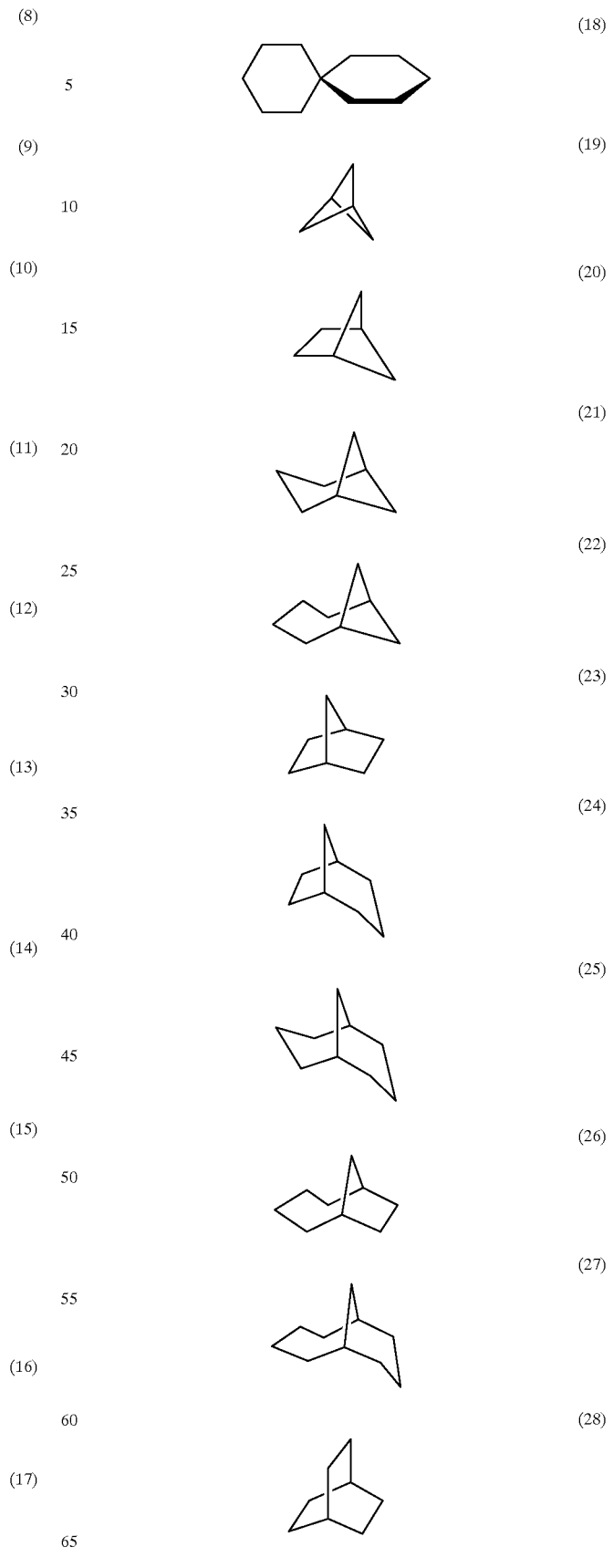

(29) 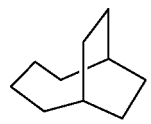
(30) 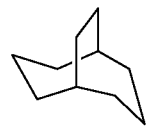
(31) 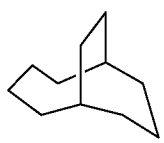
(32) 
(33) 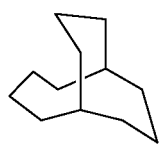
(34) 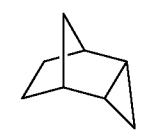
(35) 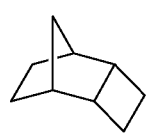
(36) 
(37) 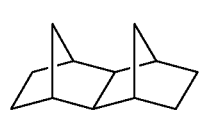
(38) 
(39) 
(40) 
(41) 
(42) 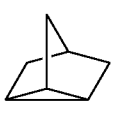
(43) 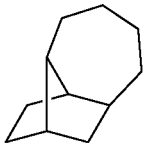
(44) 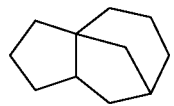
(45) 
(46) 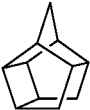
(47) 
(48) 
(49) 

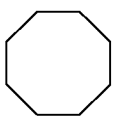
(50)

In the invention, preferred examples of the above alicyclic moiety include cyclopentyl group, adamantyl group, noradamantyl group, decaline residue, tricyclodecanyl group, tetracyclododecanyl group, norbornyl group, cedrol group, cyclohexyl group, cycloheptyl group, cyclooctyl group, cyclodecanyl group, and cyclododecanyl group. More preferred are adamantyl group, decaline residue, norbornyl group, cedrol group, cyclohexyl group, cycloheptyl group, cyclooctyl group, cyclodecanyl group, and cyclododecanyl group.

The following may be the substituent which may be present on the linear or branched alkyl group having 1 to 20 carbon atoms or alicyclic hydrocarbon group for Rna, Rnb, Rnc or Rne and the alicyclic ring to be formed by the bonding of Rna and Rnb each other.

The alkoxy group on the alkoxy group or the alkoxycarbonyl group includes alkoxy groups containing 1 to 4 carbon atoms such as methoxy group, ethoxy group, propoxy group and butoxy group.

The halogen atom includes chlorine atom, bromine atom, fluorine atom and iodine atom.

The acyl group includes formyl group, benzoyl group, and the like.

The acyloxy group includes propylcarbonyloxy group, benzoyloxy group, and the like.

The alicyclic hydrocarbon group for Rna, Rnb, Rnc or Rne and the alicyclic ring to be formed by the bonding of Rna and Rnb each other may have an alkyl group as the substitutent in addition to the above substituents. Examples include alkyl groups having 1 to 4 carbon atoms such as methyl group, ethyl group, propyl group and butyl group.

Preferred examples of W in the general formula (NII) include tertiary alkyl groups such as t-butyl group, t-amyl group, 2-cyclohexyl-2-propyl group, and 1-methylcyclohexyl group; alkoxymethyl groups such as ethoxymethyl group and ethoxyethoxymethyl group; 1-alkoxyethyl groups such as 1-ethoxyethyl group and 1-isopropoxyethyl group; adamantyl group, decaline residue, norbornyl group, cedrol group, cyclohexyl group, cycloheptyl group, cyclooctyl group, cyclodecanyl group, and cyclododecanyl group.

The following shows specific examples of the monomer corresponding to the repeating unit represented by the general formula (NII), but it should not be construed as being limited thereto.

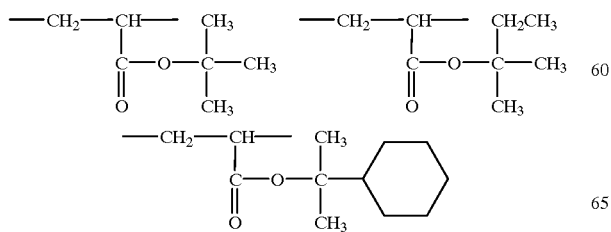

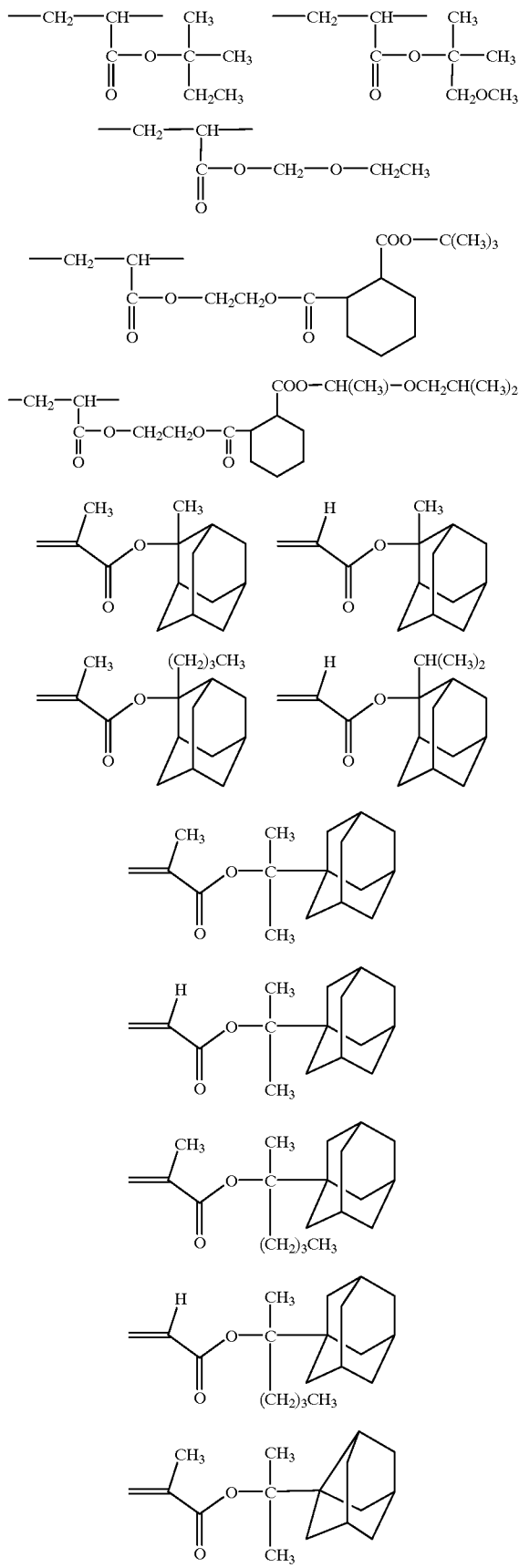

-continued

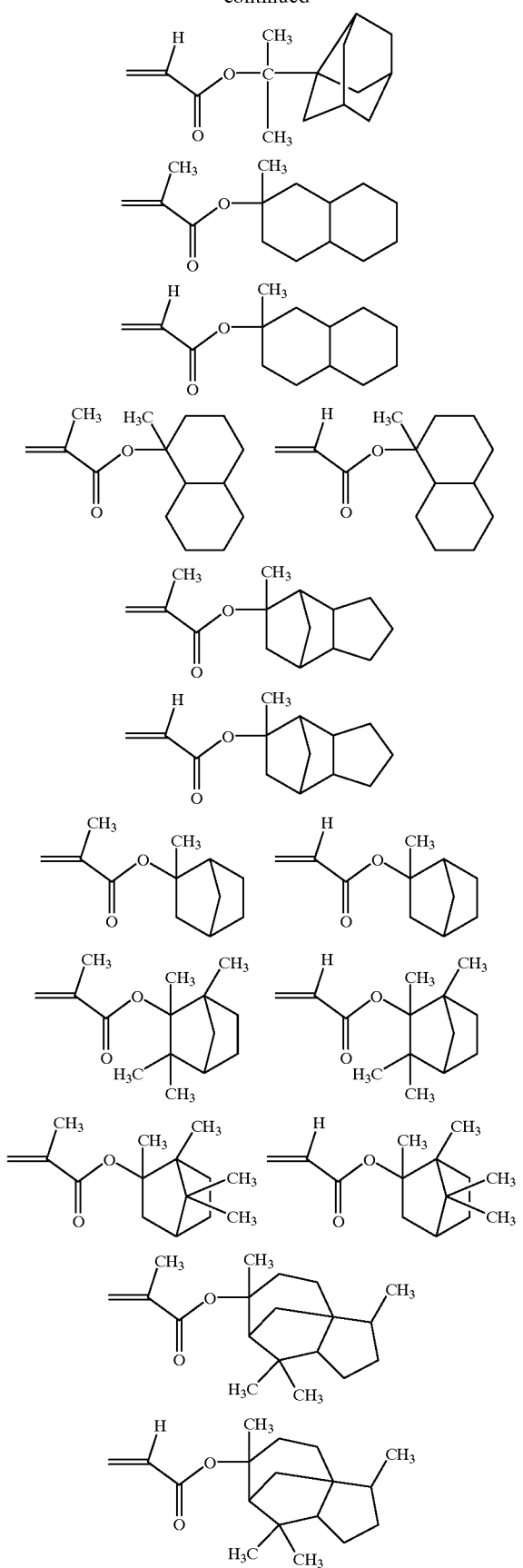

-continued

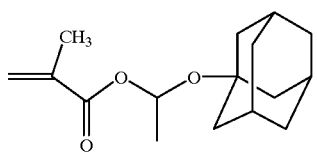
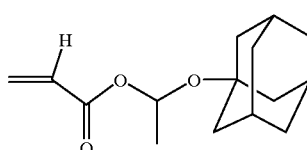
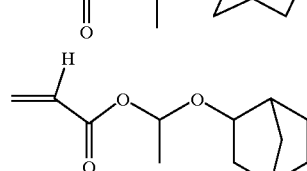
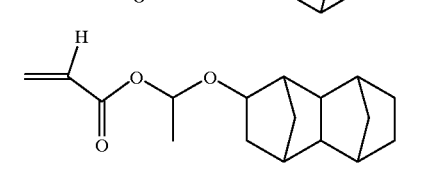
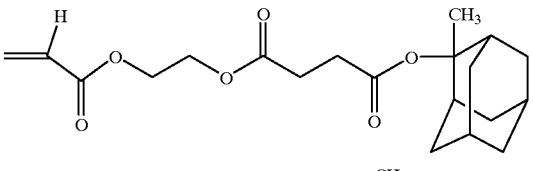
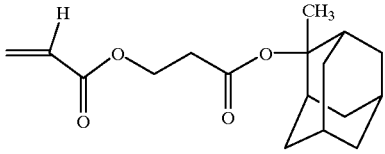

As one embodiment of the invention, the acid-decomposable resin (A1) further contains a repeating unit having a group represented by any of the following general formulae (I-1) to (I-4).

In the general formulae (I-1) to (I-4), the alkyl group for $R_1$ to $R_5$ may be a linear or branched alkyl group and may have substituent(s). The linear or branched alkyl group is preferably a linear or branched alkyl group having 1 to 12 carbon atoms, more preferably a linear or branched alkyl group having 1 to 10 carbon atoms. Further preferred examples include methyl group, ethyl group, propyl group, isopropyl group, n-butyl group, isobutyl group, sec-butyl group, t-butyl group, pentyl group, hexyl group, heptyl group, octyl group, nonyl group, and decyl group.

The cycloalkyl group for $R_1$ to $R_5$ is preferably a cycloalkyl group having 3 to 8 carbon atoms such as cyclopropyl group, cyclopentyl group, cyclohexyl group, cycloheptyl group, or cyclooctyl group.

The alkenyl group for $R_1$ to $R_5$ is preferably an alkenyl group having 2 to 6 carbon atoms such as vinyl group, propenyl group, butenyl group, or hexenyl group.

Examples of the ring formed by the bonding of two of $R_1$ to $R_5$ include 3 to 8-membered rings such as cyclopropane ring, cyclopentane ring, cyclohexane ring, and cyclooctane ring.

Incidentally, $R_1$ to $R_5$ in the general formulae (I-1) to (I-4) may be connected to any carbon atom which constitutes the cyclic skeleton.

Preferred examples of the substituent which may present on the above alkyl group, cycloalkyl group and alkenyl group include alkoxy groups having 1 to 4 carbon atoms, halogen atoms such as fluorine atom, chlorine atom, bromine atom and iodine atom, acyl groups having 2 to 5 carbon atoms, acyloxy groups having 2 to 5 carbon atoms, cyano group, hydroxyl group, carboxyl group, alkoxycarbonyl group having 2 to 5 carbon atoms, and nitro group.

Preferred repeating unit having a group represented by any of the general formulae (I-1) to (I-4) includes a repeating unit represented by the following formula (AI).

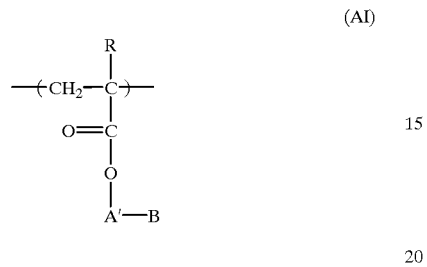

(AI)

In the general formula (AI), R represents hydrogen atom, a halogen atom, or a substituted or unsubstituted alkyl group having 1 to 4 carbon atoms. Preferred substituent which may be present on the alkyl group of R includes those previously exemplified as the preferred substituents which may be present on the alkyl group of $R_1$ in the general formulae (I-1) to (I-4). The halogen atom of R includes fluorine atom, chlorine atom, bromine atom, and iodine atom. R is preferably hydrogen atom. A' represents a divalent group selected from a singly bond, an ether group, an ester group, a carbonyl group, an alkylene group, and combinations thereof. B represents a group represented by any of the general formulae (I-1) to (I-4). In A', examples of the combined divalent groups include those represented by the following formulae.

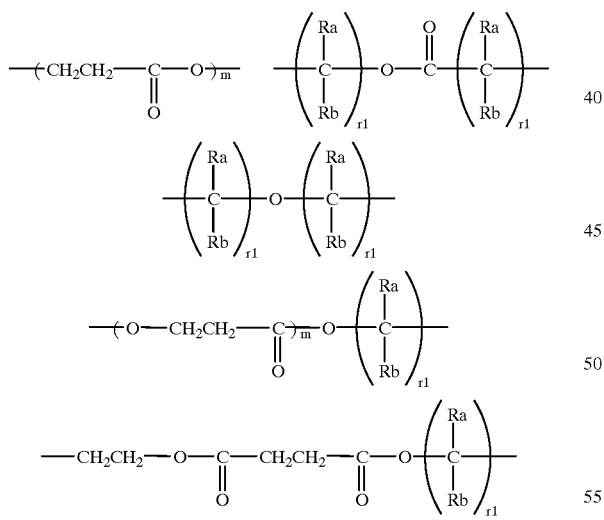

In the above formula, Ra and Rb, which may be the same or different, each represents hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group, or butyl group, and is more preferably selected from methyl group, ethyl group, propyl group, and isopropyl group. The substituent of the substituted alkyl group includes hydroxyl group, halogen atoms, and alkoxy groups having 1 to 4 carbon atoms. The alkoxy group includes those having 1 to 4 carbon atoms such as methoxy group, ethoxy group, propoxy group and butoxy group. The halogen atom includes chlorine atom, bromine atom, fluorine atom and iodine atom. $r_1$ represents an integer of 1 to 10, preferably an integer of 1 to 4. m represents an integer of 1 to 3, preferably 1 or 2.

The following shows specific examples of the repeating unit represented by the general formula (AI), but the invention should not be construed as being limited thereto.

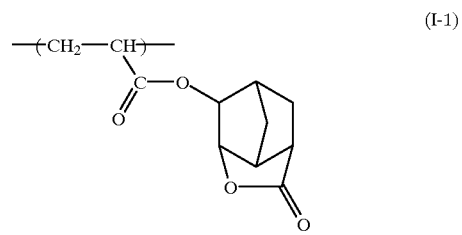

(I-1)

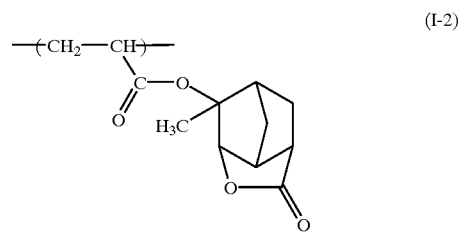

(I-2)

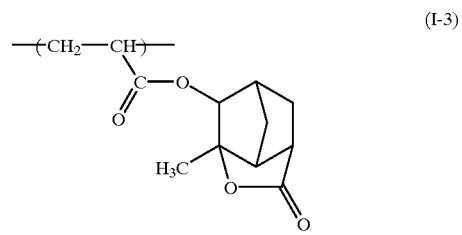

(I-3)

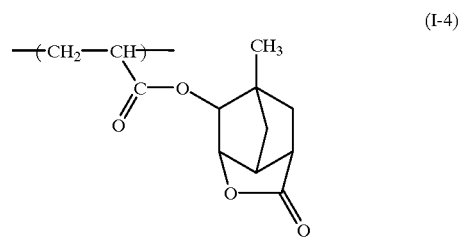

(I-4)

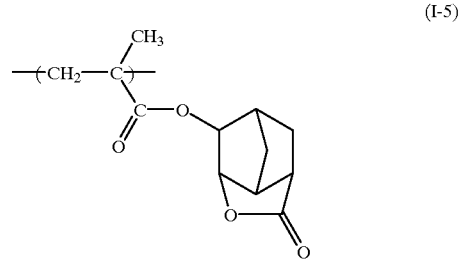

(I-5)

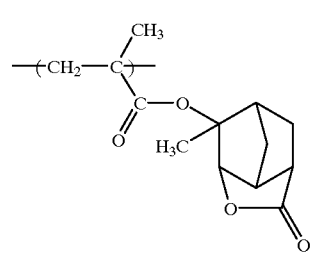

(I-6)

-continued
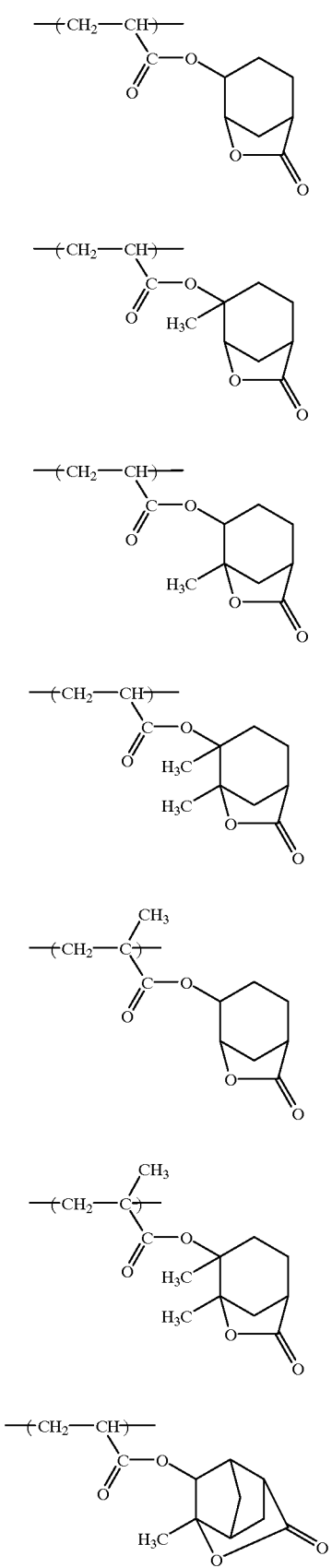
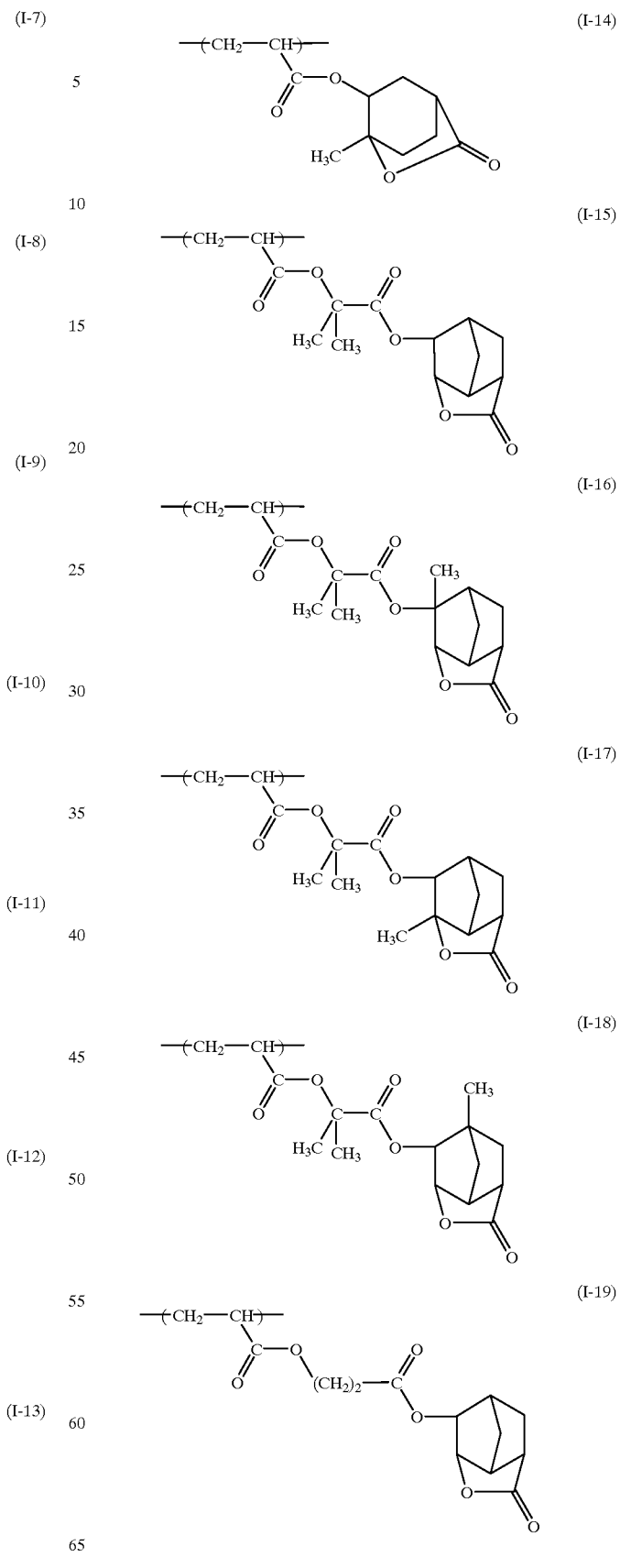

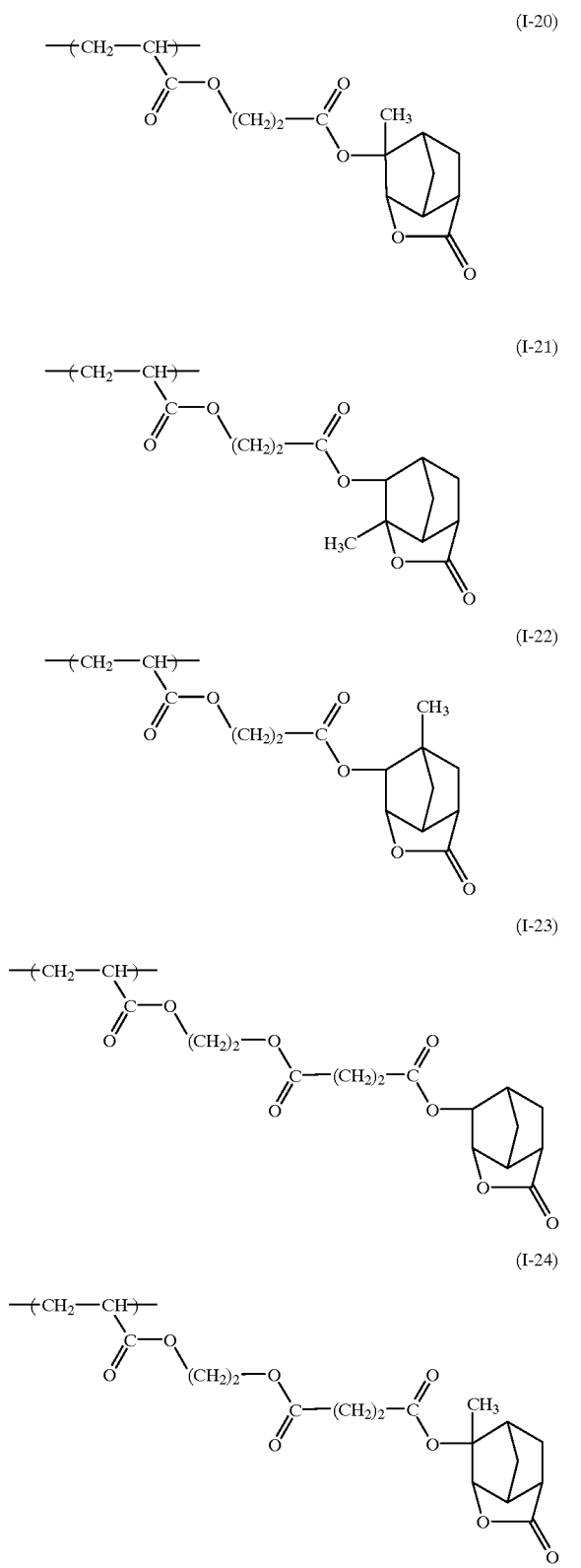
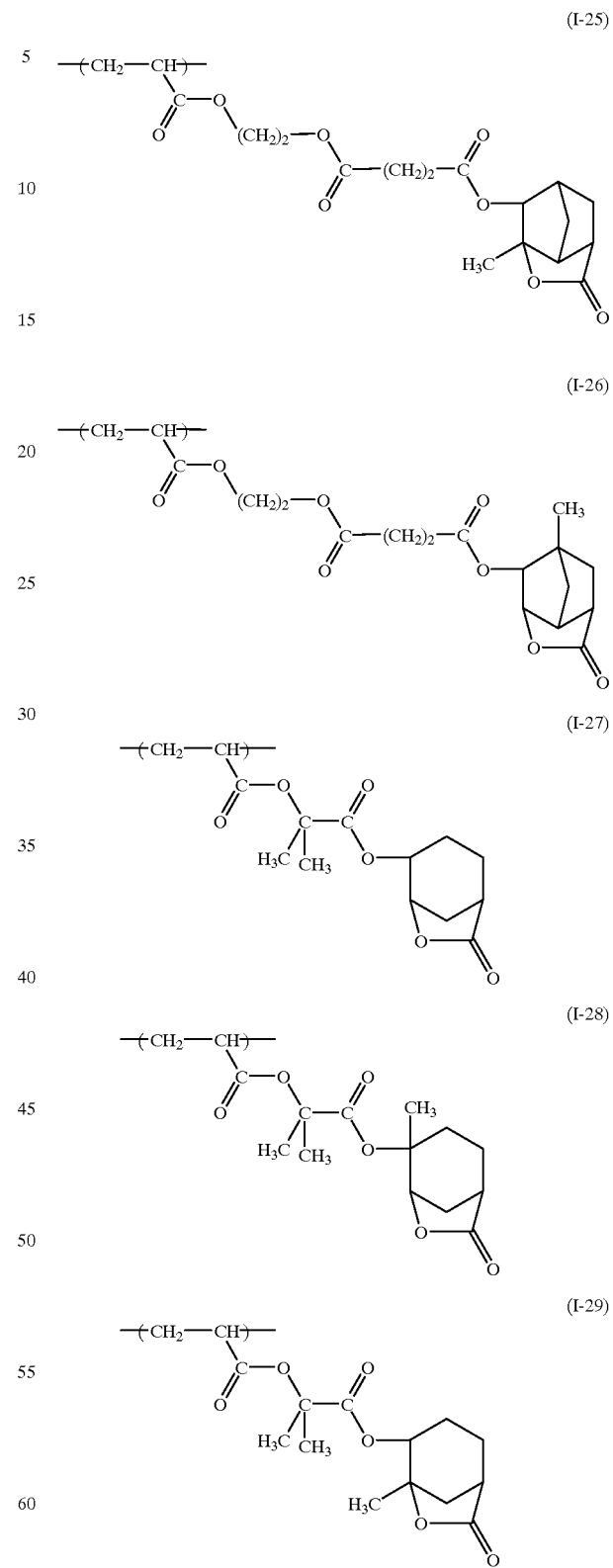

(I-30)
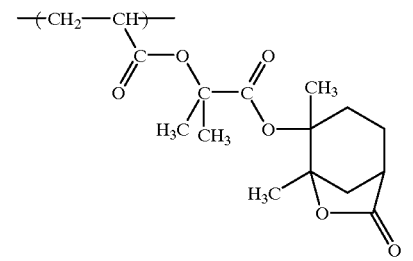
(I-31)
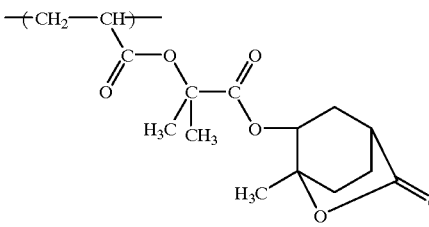
(I-32)
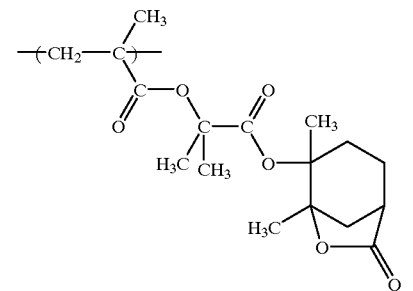
(I-33)
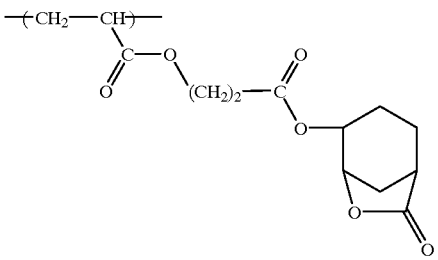
(I-34)
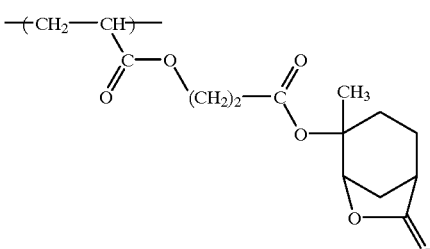
(I-35)
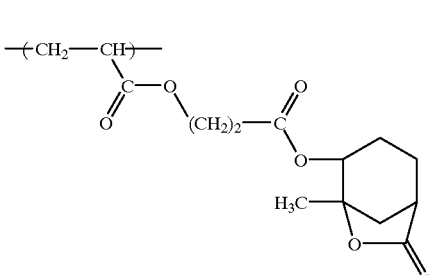
(I-36)
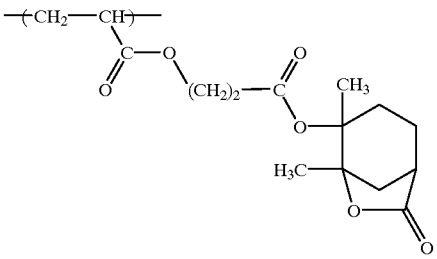
(I-37)
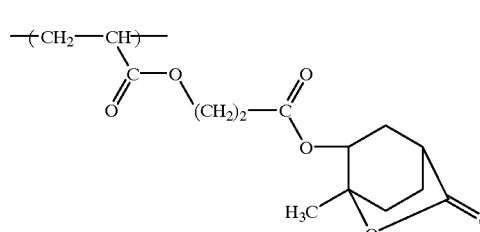
(I-38)
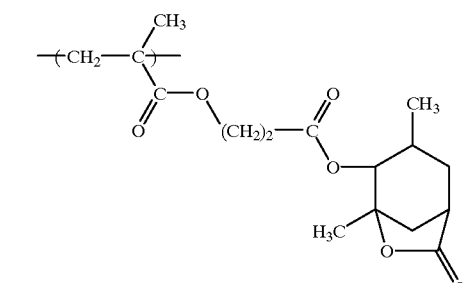
(I-39)
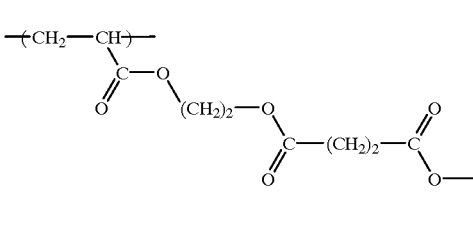
(I-40)
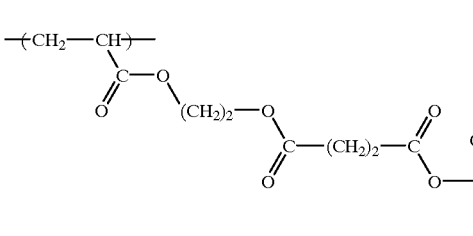

-continued

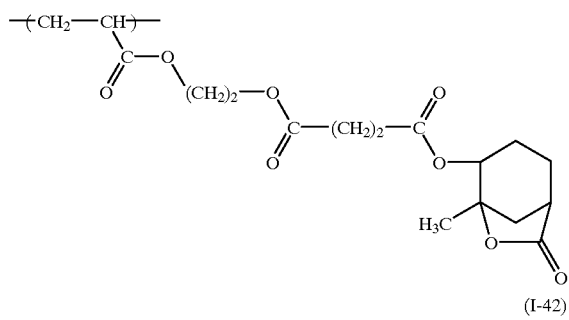
(I-41)

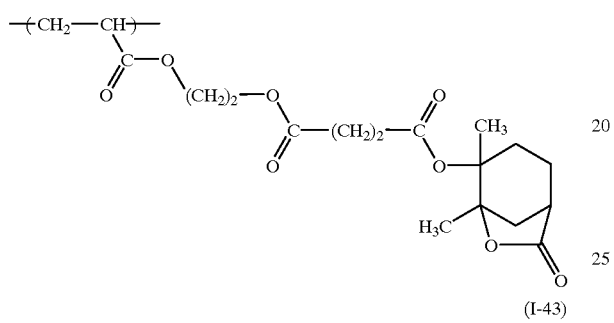
(I-42)

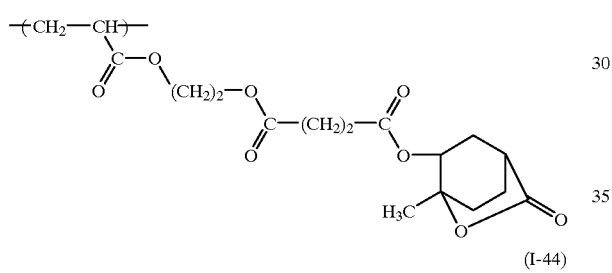
(I-43)

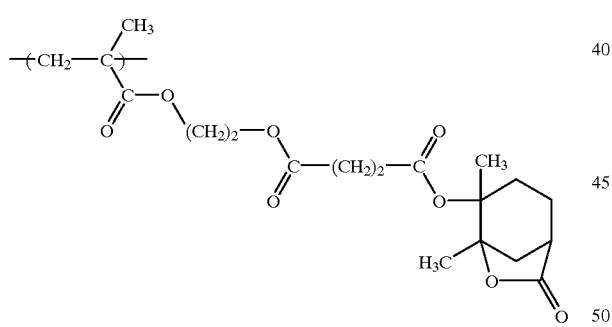
(I-44)

As another embodiment of the invention, the acid-decomposable resin (A2) further contains a repeating unit having a lactone structure represented by the above general formula (I').

In the general formula (I'), the alkylene group and the cycloalkylene group of A are the same as those mentioned as An of the formula (NII).

The bridged alicyclic ring containing z may have substituent(s). Examples of the substituent include halogen atoms, alkoxy groups preferably having 1 to 4 carbon atoms, alkoxycarbonyl groups preferably having 1 to 5 carbon atoms, acyl groups such as formyl group, and benzoyl group, acyloxy groups such as propylcarbonyloxy group and benzoyloxy group, alkyl groups preferably having 1 to 4 carbon atoms, carboxyl group, hydroxyl group, alkylsulfonylsulfamoyl groups such as —CONHSO$_2$CH$_3$. The alkyl group as the substituent may be further substituted by hydroxyl group, a halogen group, an alkoxy group preferably having 1 to 4 carbon atoms, or the like.

In the general formula (I'), the oxygen atom of the ester group bonded to A may be bonded at any position of carbon atoms which constitute the bridged cyclic ring structure containing Z.

The following shows specific examples of the repeating unit represented by the general formula (I'), but it should not be construed as being limited thereto.

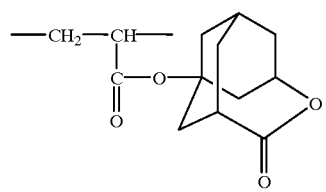

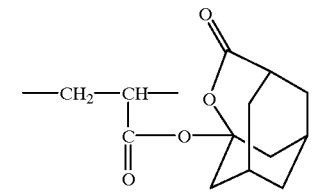

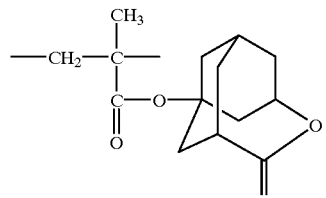

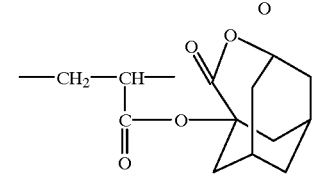

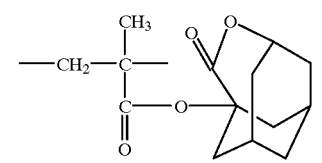

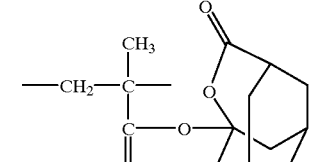

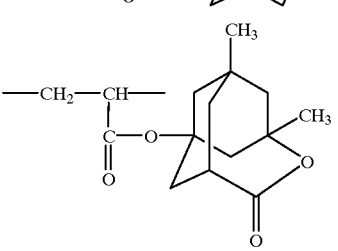

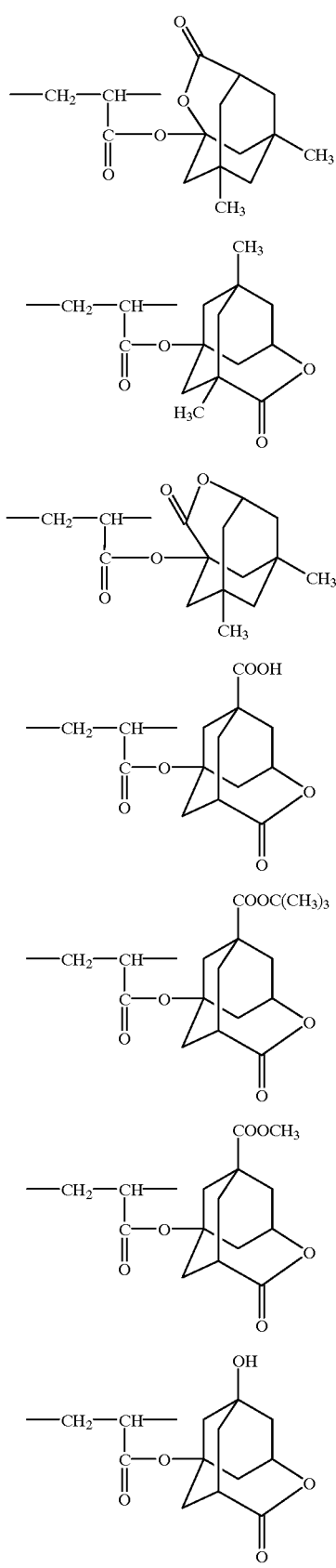

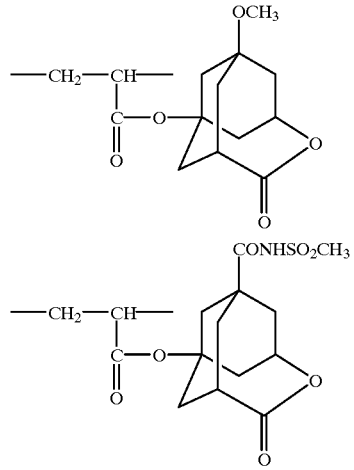

The acid-decomposable resins (A), (A1) and (A2) of the invention may further contain the repeating unit represented by the above general formula (NIII).

In the general formula (NIII), $Z_1$ represents —O— or —N(Rn$_6$)—, wherein Rn$_6$ represents a hydrogen atom, an alkyl group, a haloalkyl group, a hydroxyl group or —OSO$_2$—Rn$_7$, and Rn$_7$ represents an alkyl group, a haloalkyl group, a cycloalkyl group or a camphor residue.

The alkyl group for Rn$_6$ or Rn$_7$ is preferably a linear or branched alkyl group having 1 to 10 carbon atoms, more preferably a linear or branched alkyl group having 1 to 6 carbon atoms, further preferably methyl group, ethyl group, propyl group, isopropyl group, n-butyl group, isobutyl group, sec-butyl group, or t-butyl group.

The haloalkyl group for Rn$_6$ or Rn$_7$ includes trifluoromethyl group, nanofluorobutyl group, pentadecafluorooctyl group, trichloromethyl group, and the like.

The cycloalkyl group for Rn$_7$ includes cyclopentyl group, cyclohexyl group, cyclooctyl group, and the like.

The following shows specific examples of the monomer corresponding to the repeating unit represented by the general formula (NIII), but it should not be construed as being limited thereto.

(NIII-1)

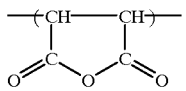

(NIII-2)

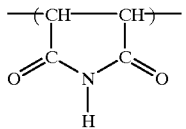

(NIII-3)

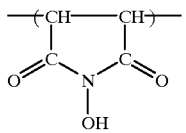

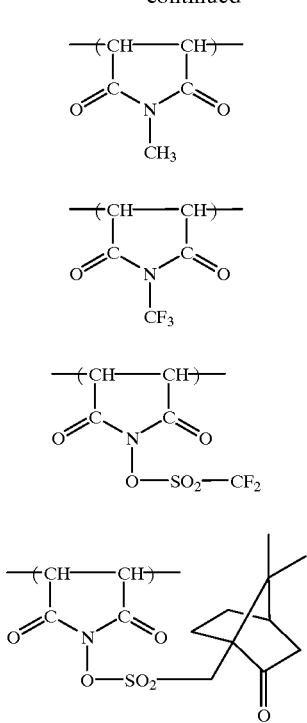

(NIII-4)

(NIII-5)

(NIII-6)

(NIII-7)

The acid-decomposable resin of the component (A) may contain various repeating units in addition to the above repeating units for the purpose of controlling dry etching resistance, compatibility to a standard developing solution, adhesion to a substrate, resist profile, and further properties generally required for resist such as resolving power, heat resistance and sensitivity.

As such repeating units, the repeating units corresponding to the following monomers, but they should not be construed as being limited thereto.

Thereby, minute control of the properties required for the acid-decomposable resins is enabled, including particularly (1) solubility in a coating solvent, (2) film formability (glass transition temperature), (3) alkali developability, (4) film thickness loss (hydrophobicity, selection of alkali-soluble groups), (5) adhesiveness to a substrate in the unexposed area and (6) dry etching resistance.

Examples of such monomers include compounds having one addition-polymerizable unsaturated bond selected from acrylate esters, methacrylate esters, acrylamides, methacrylamides, allyl compounds, vinyl ethers, and vinyl esters.

More specifically, the monomers include the following:

acrylate esters (preferably, alkyl acrylates whose alkyl group has 1 to 10 carbon atoms):
  methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate, and the like;

methacrylates (preferably, alkyl methacrylates whose alkyl group has 1 to 10 carbon atoms):
  methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, and the like;

acrylamides:
  acrylamide, N-alkylacrylamides (the alkyl groups of which are those having 1 to 10 carbon atoms, e.g., methyl group, ethyl group, propyl group, butyl group, t-butyl group, heptyl group, octyl group, cyclohexyl group, hydroxyethyl group), N,N-dialkylacrylamides (those whose alkyl group has 1 to 10 carbon atoms, e.g., methyl group, ethyl group, butyl group, isobutyl group, ethylhexyl group, cyclohexyl group), N-hydroxyethyl-N-methylacrylamide, and N-2-acetamidoethyl-N-acetylacrylamide, and the like;

methacrylamide:
  methacrylamide, N-alkylmethacrylamides (the alkyl groups of which are those having 1 to 10 carbon atoms, e.g., methyl group, ethyl group, t-butyl group, ethylhexyl group, hydroxyethyl group, cyclohexyl group), N,N-dialkylmethacrylamides (the alkyl groups of which are, e.g., ethyl group, propyl group and butyl group), N-hydroxyethyl-N-methylmethacrylamide, and the like;

allyl compounds:
  allyl esters (e.g., allyl acetate, allyl caproate, allyl caprate, allyl laurate, allyl palmitate, allyl stearate, allyl benzoate, allyl acetoacetate, allyl lactate), allyl oxyethanol, and the like;

vinyl ethers:
  alkyl vinyl ethers (e.g., hexyl vinyl ether, octyl vinyl ether, decyl vinyl ether, ethyl hexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and the like;

vinyl esters:
  vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, vinyl cyclohexylcarboxylate, and the like;

dialkyl itaconates:
  dimethyl itaconate, diethyl itaconate, dibutyl itaconate, and the like;

dialkyl fumarates or monoalkyl fumarates: dibuty fumarate, and the like;

crotonic acid, itaconic acid, acrylonitrile, methacrylonitrile, maleylonitrile, and the like.

In addition to the compounds as described above, any of addition-polymerizable unsaturated compounds may be used as comonomers so long as they can be copolymerized with the above various repeating units.

In the acid-decomposable resin, the molar ratio of each repeating unit can be determined appropriately in view of controlling the dry etching resistance, compatibility to a standard developing solution, adhesion to a substrate and resist profile of a resist, and further properties generally required for resist such as resolution, heat resistance, and sensitivity.

The content of the repeating unit represented by the general formula (I) in the acid-decomposable resin (A), (A1), or (A2) is preferably 25 to 70 mol %, more preferably 28 to 65 mol %, and further preferably 30 to 60 mol %, in the total repeating units.

The content of the repeating unit represented by the general formula (II) in the acid-decomposable resin (A) is preferably 2 to 50 mol %, more preferably 4 to 45 mol %, and further preferably 6 to 40 mol %, in the total repeating units.

The content of the repeating unit represented by the general formula (III) in the acid-decomposable resin (A) is preferably 20 to 80 mol %, more preferably 25 to 70 mol %, and further preferably 30 to 60 mol %, in the total repeating units.

The content of the repeating unit represented by the general formula (NII) in the acid-decomposable resin (A1) or (A2) is preferably 2 to 50 mol %, more preferably 4 to 45 mol %, and further preferably 6 to 40 mol % in the total repeating units.

The content of the repeating units having groups represented by the general formulae (I-1) to (I-4) in the acid-decomposable resin (A1) is preferably 1 to 30 mol %, more preferably 3 to 25 mol %, and further preferably 5 to 20 mol % in the total repeating units.

The content of the repeating unit represented by the general formula (I') in the acid-decomposable resin (A2) is preferably 1 to 40 mol %, more preferably 3 to 30 mol %, and further preferably 5 to 20 mol % in the total repeating units.

The content of the repeating unit represented by the general formula (NIII) in the acid-decomposable resin (A), (A1), or (A2) is preferably 20 to 80 mol %, more preferably 25 to 70 mol %, and further preferably 30 to 60 mol %, in the total repeating units.

The content of the repeating units derived from the above monomers described as the optional copolymerizing component in the resin can be determined properly according to the desired resist properties. In general, it is preferably 99 mol % or less, more preferably 90 mol % or less, further preferably 80 mol % or less, relative to the total moles of the repeating units represented by the general formula (I) and (NII). Incidentally, when the composition of the invention is used for ArF exposure, the acid-decomposable resin preferably contains no aromatic ring in view of the transparency toward ArF light.

The weight average molecular weight of each acid-decomposable resin as described above ranges preferably from 1,000 to 1,000,000, more preferably from 1,500 to 500,000, further preferably from 2,000 to 200,000, more further preferably from 2,500 to 100,000. The larger molecular weight improves heat resistance but deteriorates developability, and therefore, it is determined within a preferable range in consideration of the balance. The acid-decomposable resins for use in the invention can be synthesized according to conventional methods, e.g., radical polymerization.

In the positive photoresist composition of the invention, the content of the acid-decomposable resin in the total photoresist composition is from 40 to 99.99% by weight, preferably from 50 to 99.97% by weight, relative to the total solid content in the resist.

The following shows preferred specific examples of the combination of the repeating units of the acid-decomposable resin of the component (A).

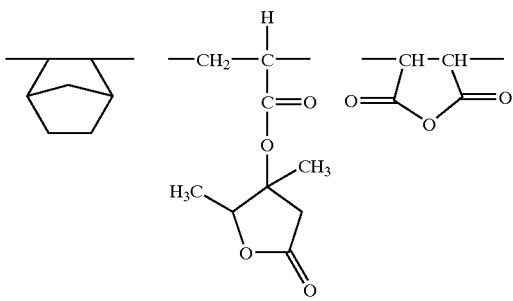

(1-1)

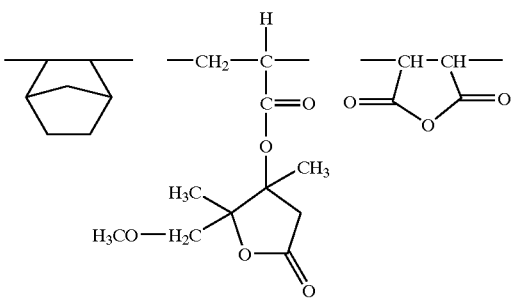

(1-2)

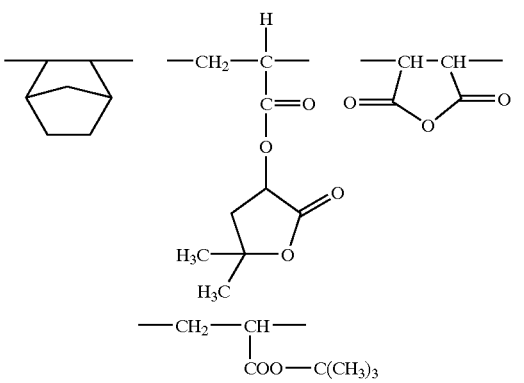

(1-3)

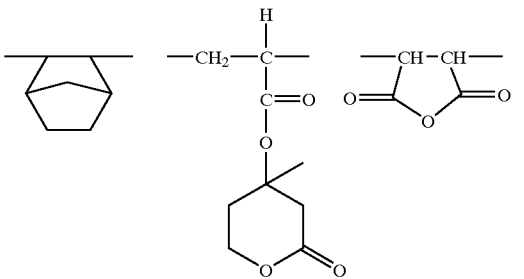

(1-4)

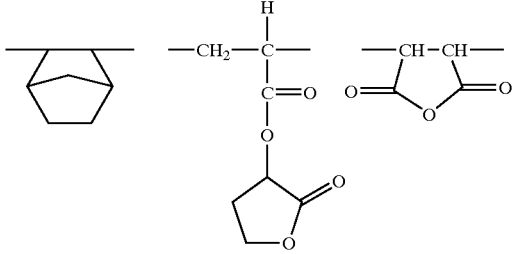

(1-5)

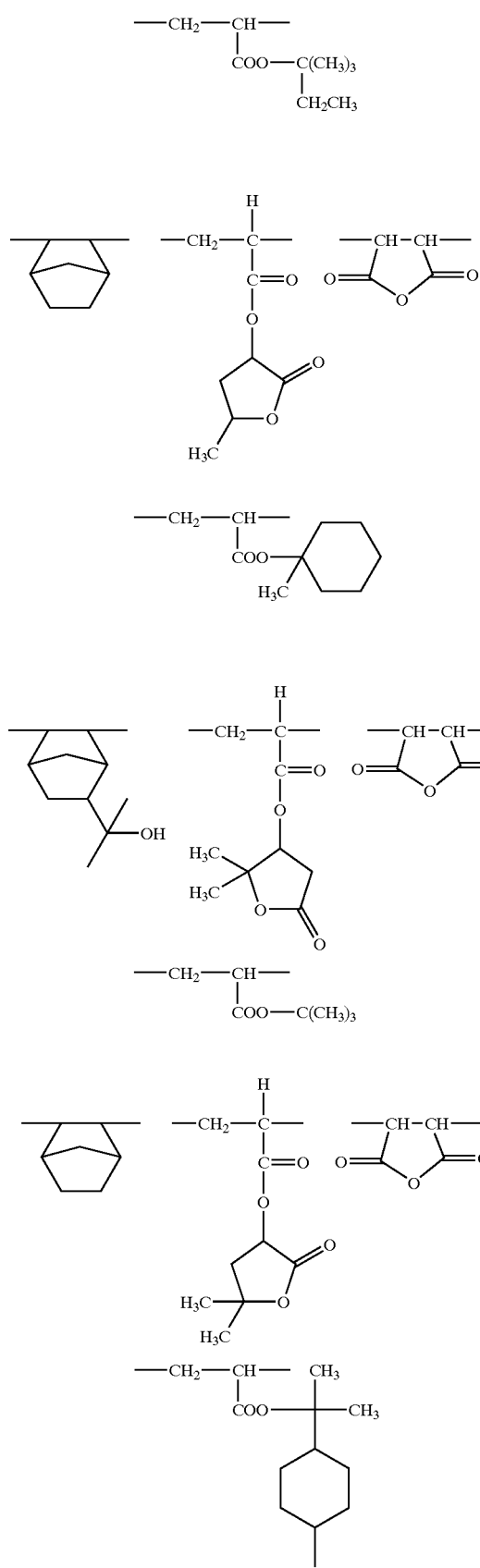
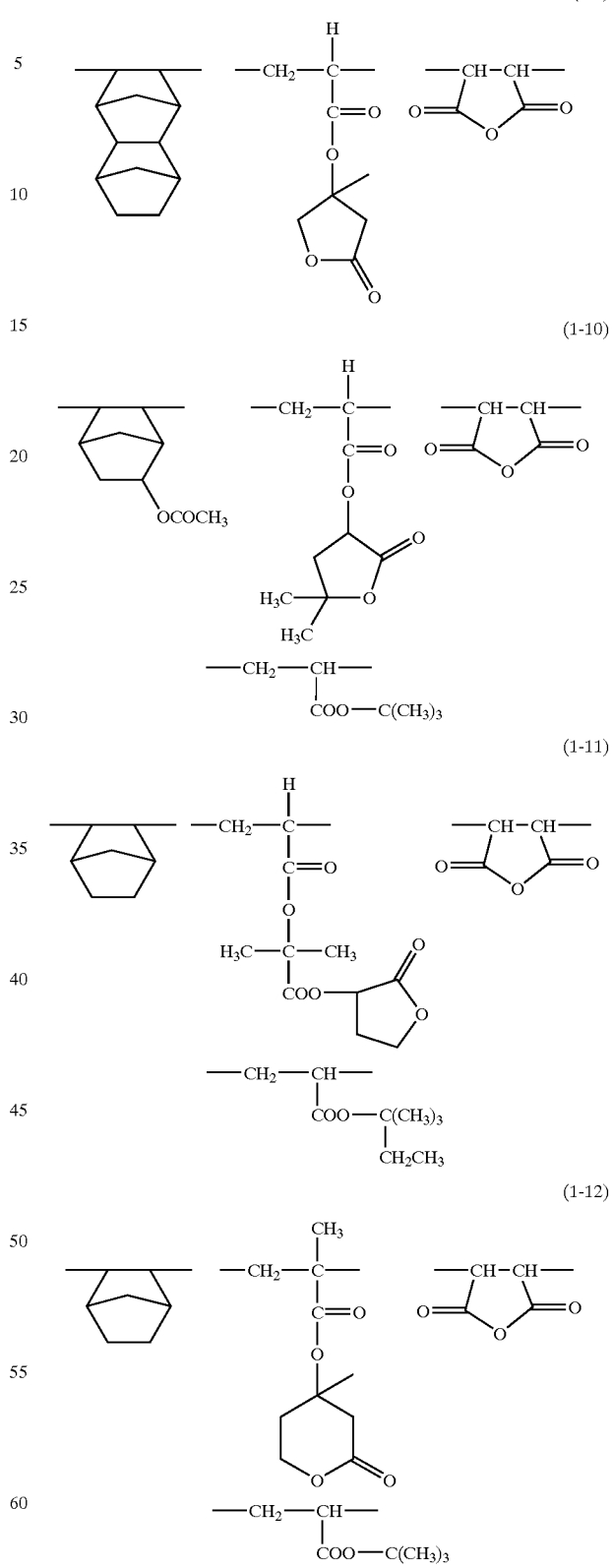
The following shows preferred specific examples of the combination of the repeating units of the acid-decomposable resin of the component (A1).

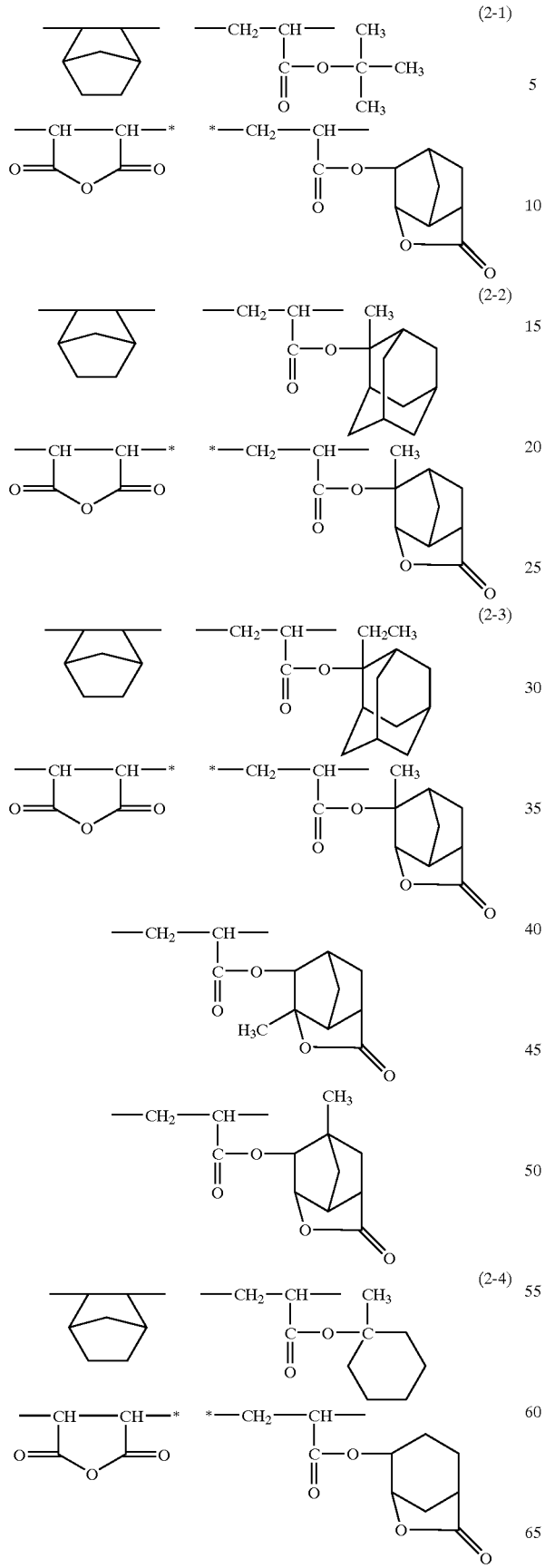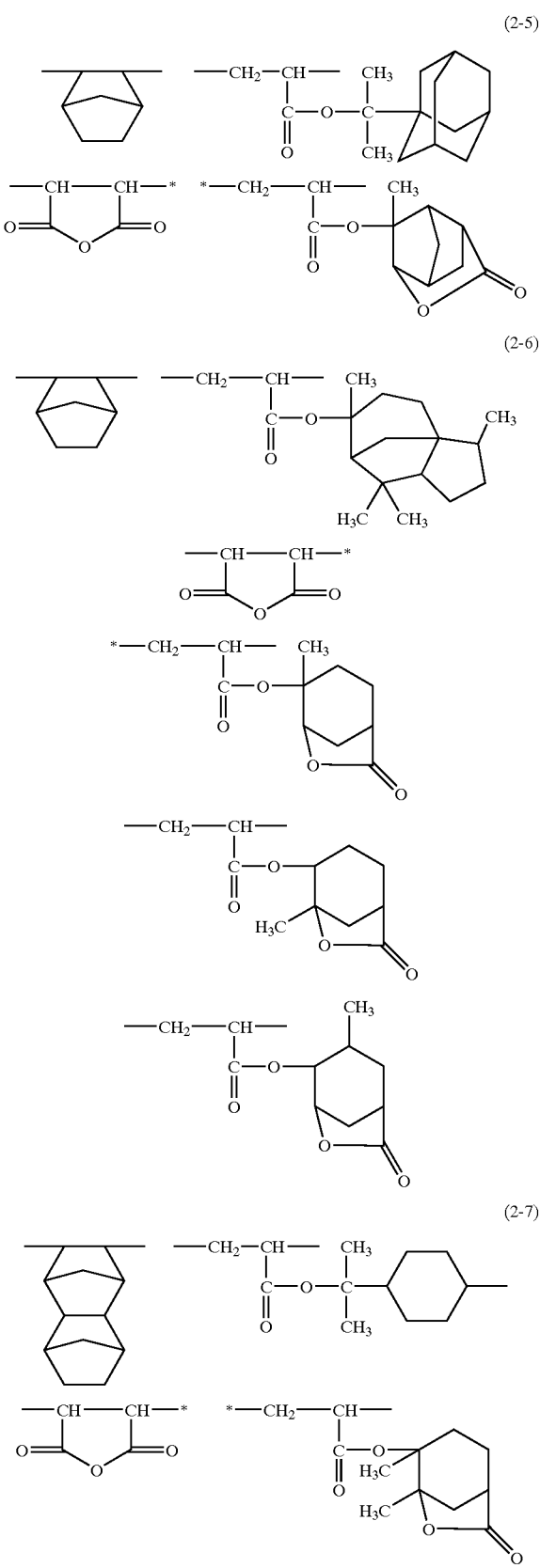

(2-8)
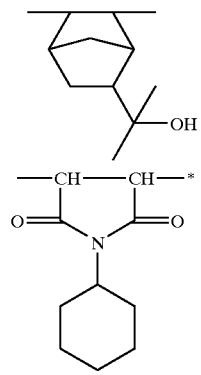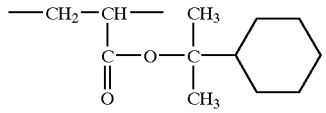
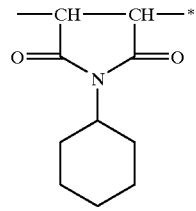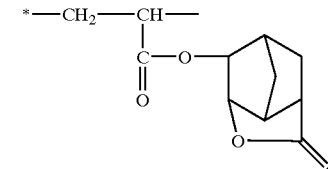
(2-9)

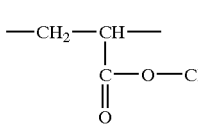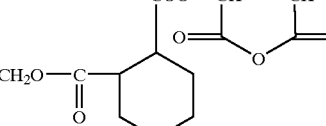
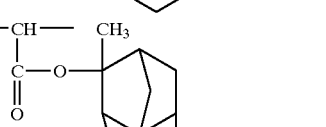
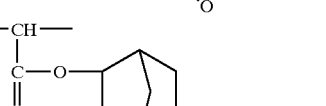
The following shows preferred specific examples of the combination of the repeating units of the acid-decomposable resin of the component (A2).
(3-1)
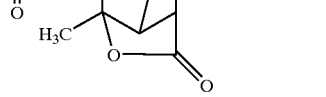
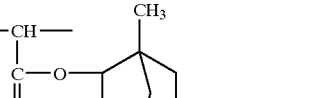
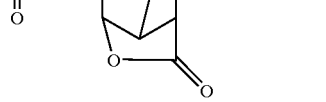
(3-2)
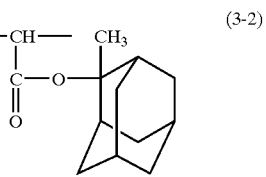
(3-3)
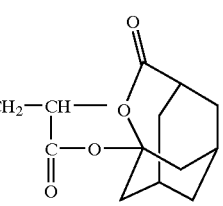
(3-4)
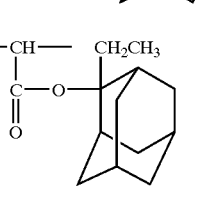
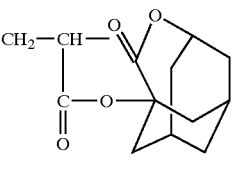
(3-5)
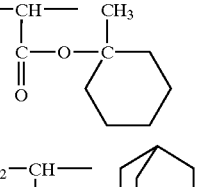
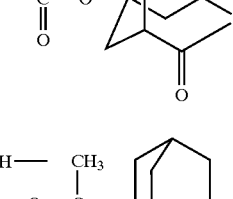
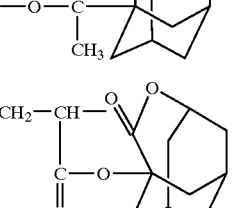
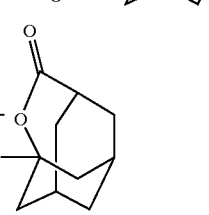

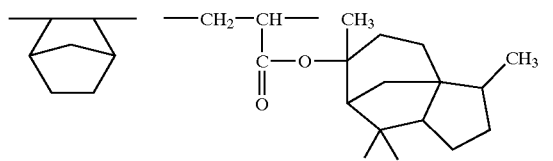

(3-6)

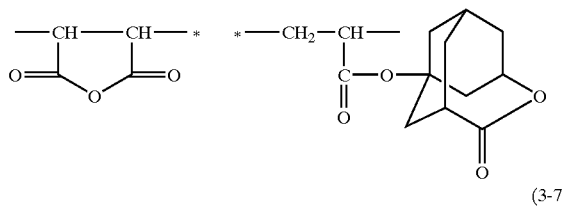

(3-7)

(3-8)

(3-9)

[2] (B) a compound which generates an acid upon irradiation with an actinic ray or a radiation (photo-acid generator)

The photo-acid generator for use in the invention is a compound which generates an acid upon irradiation with an actinic ray or a radiation.

The photo-acid generator for use in the invention may be suitably selected from photoinitiators for cationic photopolymerization, photoinitiators for radical photopolymerization, photodecolorants for dyes, optical color changers, compounds which generate an acid by the action of a light known to be used, e.g., for microresist production (ultraviolet light or far ultraviolet light of 400 to 200 nm, particularly preferably g-, h-, or i-lines, or KrF excimer laser beam) or of ArF excimer laser beam, electron beam, X-ray, molecular beam, or ion beam, and mixtures thereof.

Other examples of the photo-acid generator for use in the present invention include onium salts such as diazonium salts, ammonium salts, phosphonium salts, iodonium salts, sulfonium salts, selenonium salts, and arsonium salts; organic halogeno-compounds; the organometallic compound/organic halide; photo-acid generators having an o-nitrobenzyl type protective group; compounds which generate a sulfonic acid through photodecomposition, the representatives being iminosulfonates; disulfone compounds; and diazoketosulfones; diazodisulfone compounds.

Furthermore, a compound obtainable by incorporating such groups or compounds which generate an acid by the action of a light into the backbone or side chains of a polymer can be used.

In addition, the compounds capable of generating acids by the action of a light as disclosed, e.g., in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778 and European Patent No. 126,712 can also be used.

Among the above compounds which are decomposed by irradiation with electron beam to generate acids, the compounds particularly advantageously used are explained below.

(1) Trihalomethyl-substituted oxazole derivatives represented by the following general formula (PAG1) and trihalomethyl-substituted s-triazine derivatives represented by the following general formula (PAG2):

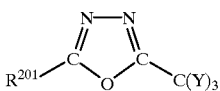

(PAG1)

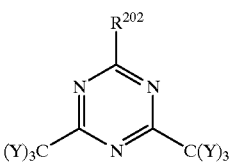

(PAG2)

wherein $R^{201}$ represents a substituted or unsubstituted aryl group or alkenyl group; $R^{202}$ represents a substituted or unsubstituted aryl group, alkenyl group, alkyl group or —$C(Y)_3$; and Y represents chlorine atom or bromine atom.

The following compounds show specific examples, but the compounds represented by general formula (PAG1) or (PAG2) are not limited thereto.

(PAG1-1)
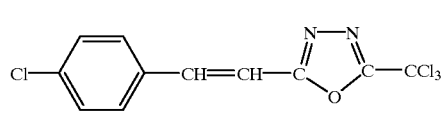
(PAG1-2)
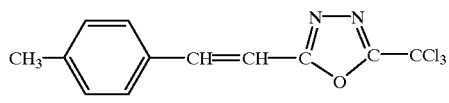
(PAG1-3)
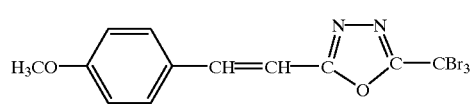
(PAG1-4)
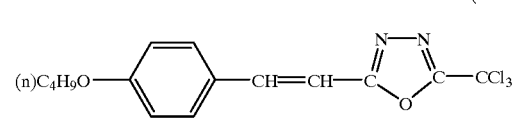
(PAG1-5)
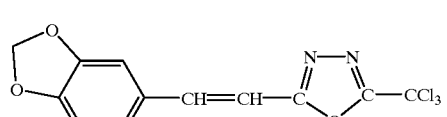
(PAG1-6)
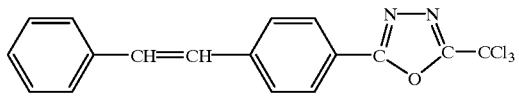
(PAG1-7)
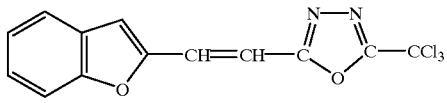
(PAG1-8)
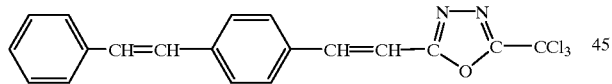
(PAG2-1)
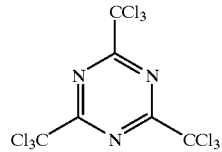
(PAG2-2)
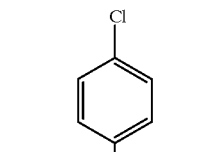
-continued
(PAG2-3)
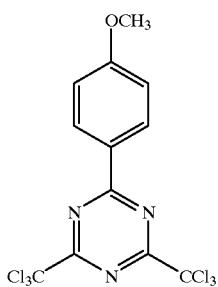
(PAG2-4)
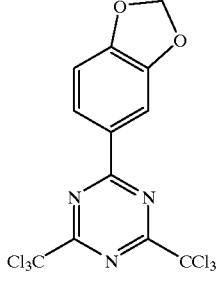
(PAG2-5)
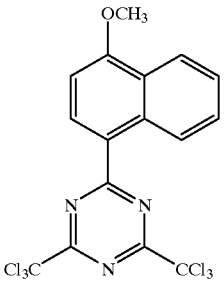
(PAG2-6)
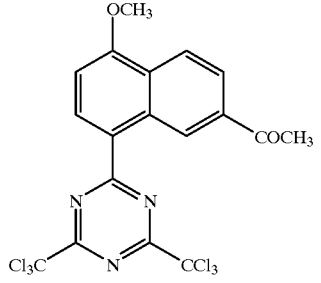
(PAG2-7)
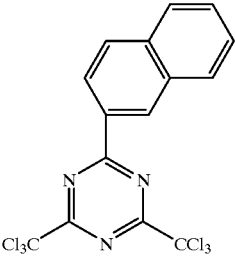

-continued

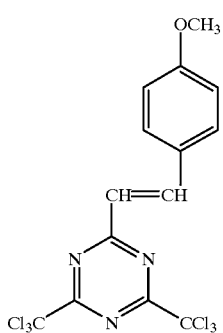
(PAG2-8)

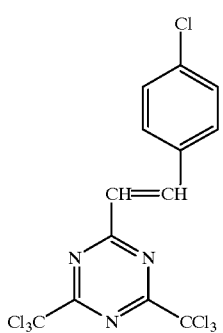
(PAG2-9)

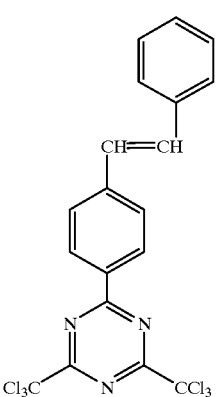
(PAG2-10)

(2) Iodonium salts represented by the following general formula (PAG3) and sulfonium salts represented by the following general formula (PAG4):

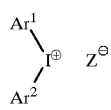
(PAG3)

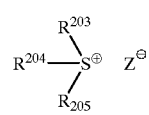
(PAG4)

wherein, $Ar^1$ and $Ar^2$ each independently represents a substituted or unsubstituted aryl group.

$R^{203}$, $R^{204}$, and $R^{205}$ each independently represents a substituted or unsubstituted alkyl group or aryl group.

$Z^-$ represents a counter anion. Examples thereof include $BF_4^-$, $AsF_6^-$, $PF_6^-$, $SbF_6^-$, $SiF_6^{2-}$, $ClO_4^-$, perfluoroalkane-sulfonate anions such as $CF_3SO_3^-$, a pentafluorobenzene-sulfonate anion, fused-ring aromatic sulfonate anions such as naphthalene-1-sulfonate anion, an anthraquinone-sulfonate anion, dyes containing a sulfonate group, and the like. However, the counter anion should not be construed as being limited thereto.

Two of $R^{203}$, $R^{204}$, and $R^{205}$ as well as $Ar^1$ and $Ar^2$ may be bonded to each other through a single bond or substituent thereof.

The following compounds show specific examples, but the compounds represented by general formula (PAG3) or (PAG4) should not be construed as being limited thereto.

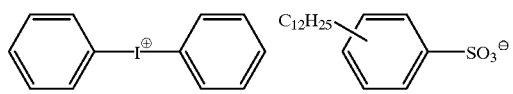
(PAG3-1)

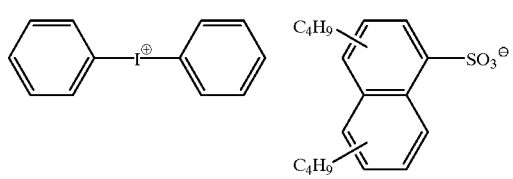
(PAG3-2)

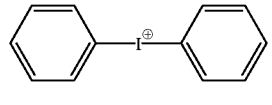
(PAG3-3)

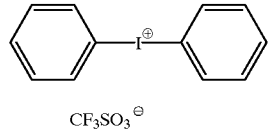
(PAG3-4)

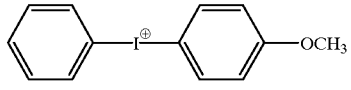
(PAG3-5)

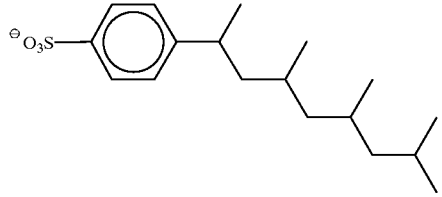

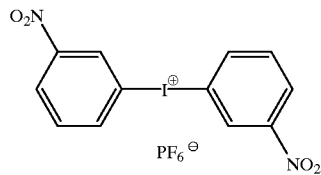
(PAG3-6)

-continued
(PAG3-7)
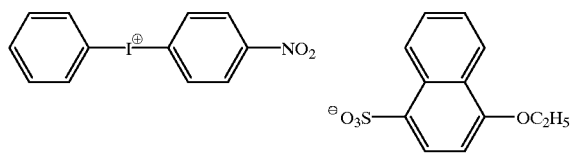
(PAG3-8)
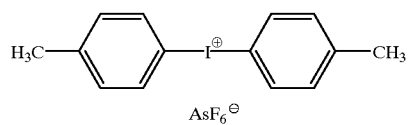
(PAG3-9)
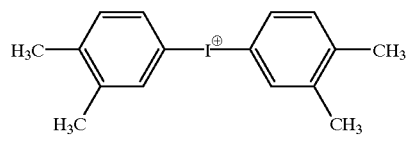
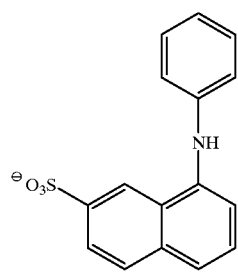
(PAG3-10)
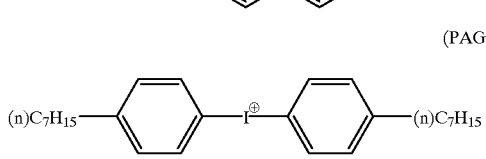
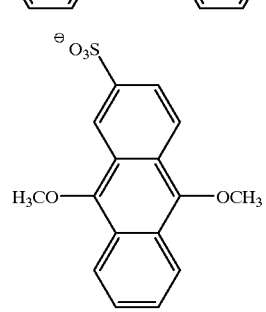
(PAG3-11)
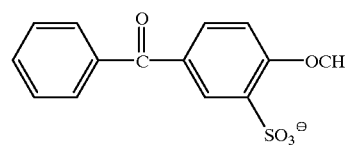
(PAG3-12)
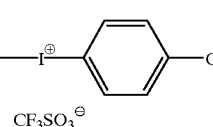
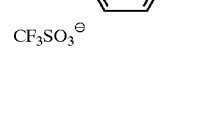
-continued
(PAG3-13)
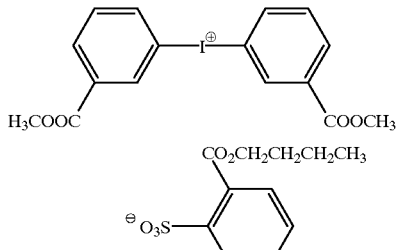
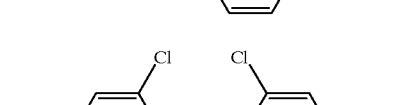
(PAG3-14)
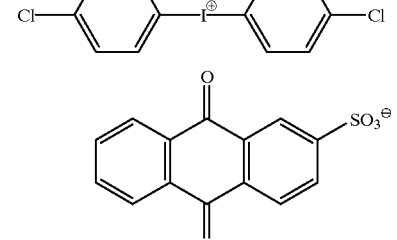
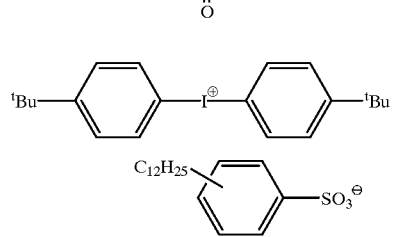
(PAG3-15)
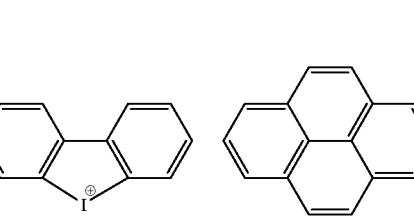
(PAG3-16)
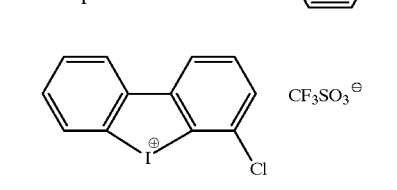
(PAG3-17)
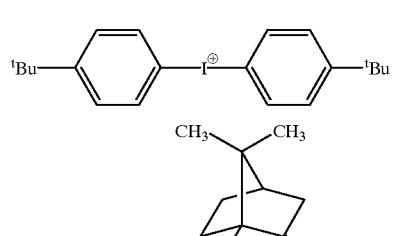
(PAG3-18)
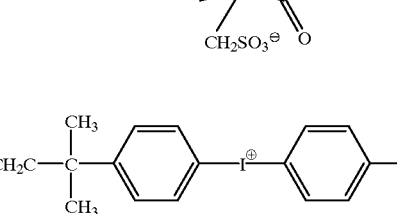
(PAG3-19)
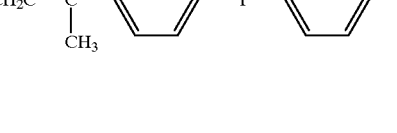

-continued
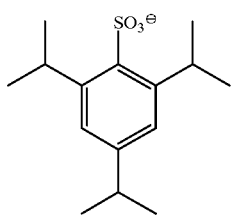
(PAG3-20)
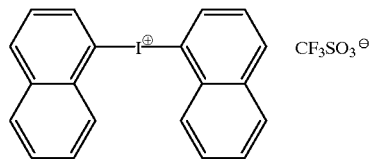
(PAG3-21)
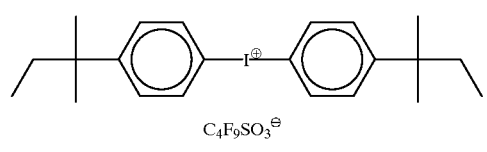
(PAG3-22)
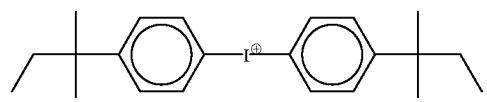
(PAG3-23)
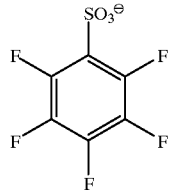
(PAG3-24)
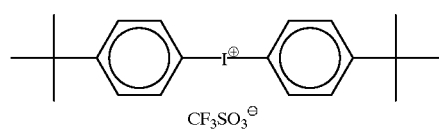
(PAG3-25)
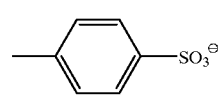
-continued
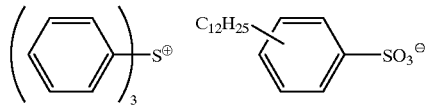
(PAG4-1)
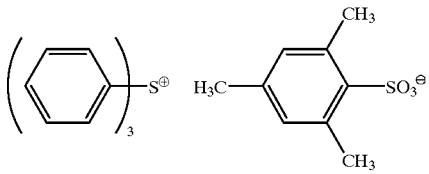
(PAG4-2)
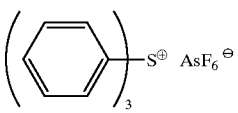
(PAG4-3)
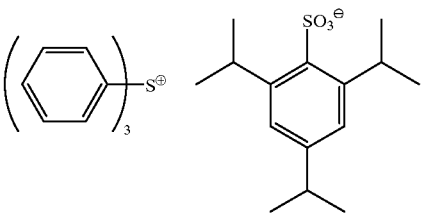
(PAG4-4)
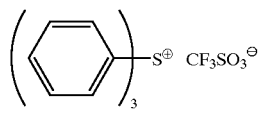
(PAG4-5)
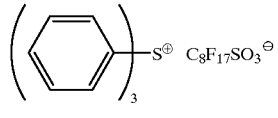
(PAG4-6)
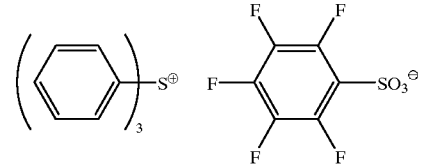
(PAG4-7)
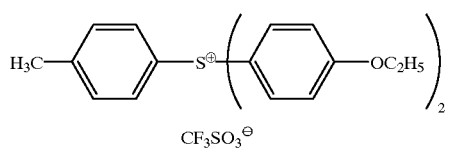
(PAG4-8)
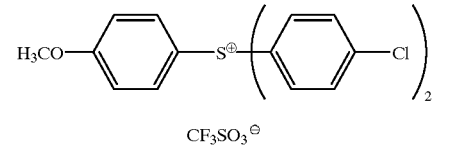
(PAG4-9)
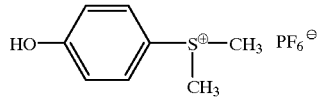
(PAG4-10)

(PAG4-11)
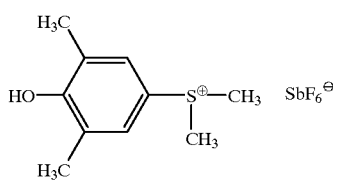
(PAG4-12)
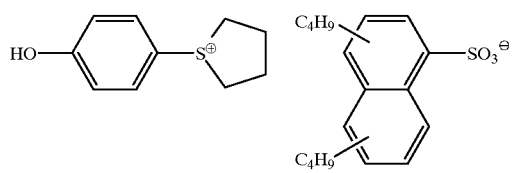
(PAG4-13)
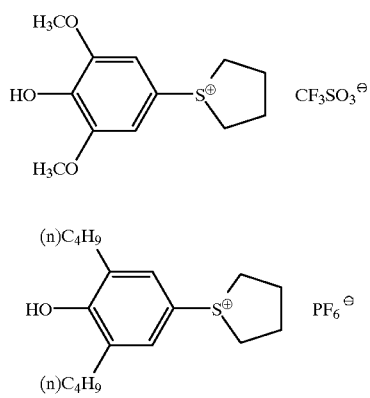
(PAG4-14)
(PAG4-15)
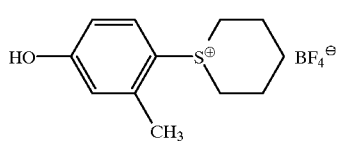
(PAG4-16)
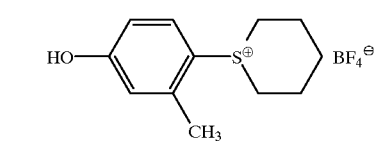
(PAG4-17)
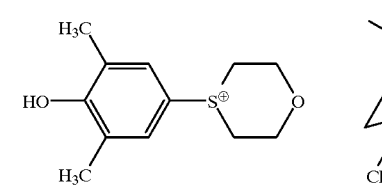
(PAG4-18)
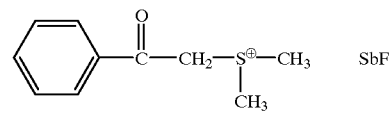
(PAG4-19)
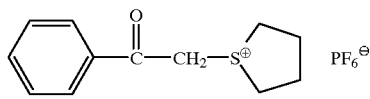
(PAG4-20)
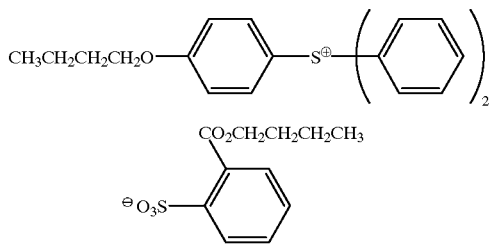
(PAG4-21)
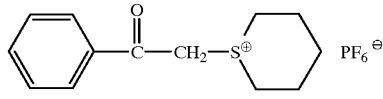
(PAG4-22)
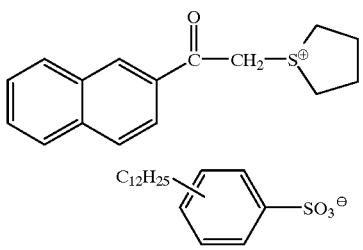
(PAG4-23)
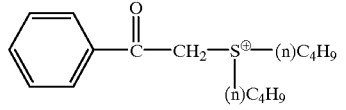
(PAG4-24)
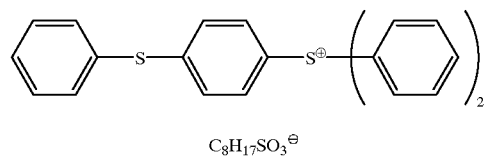
(PAG4-25)
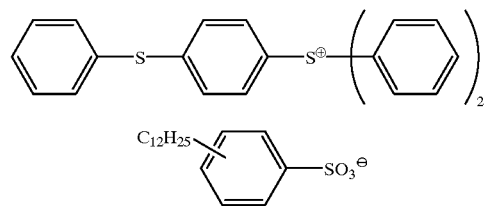
(PAG4-26)
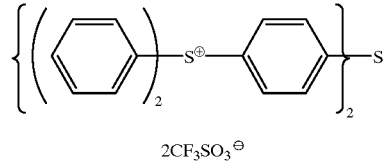

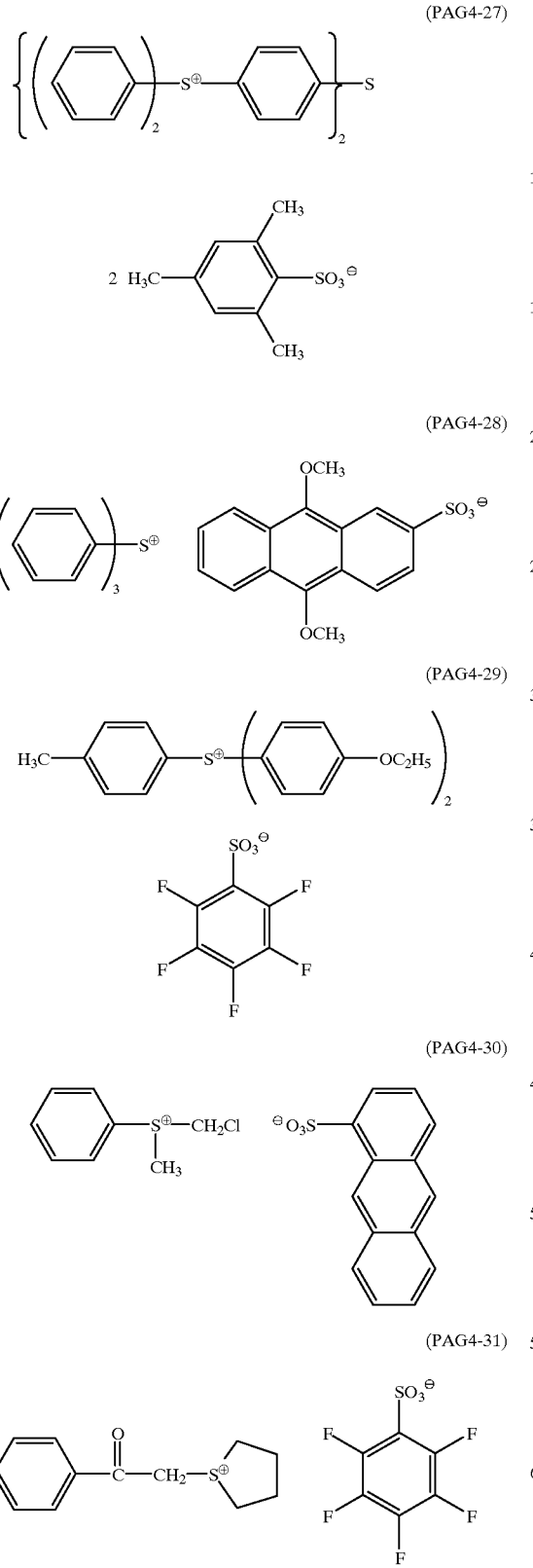
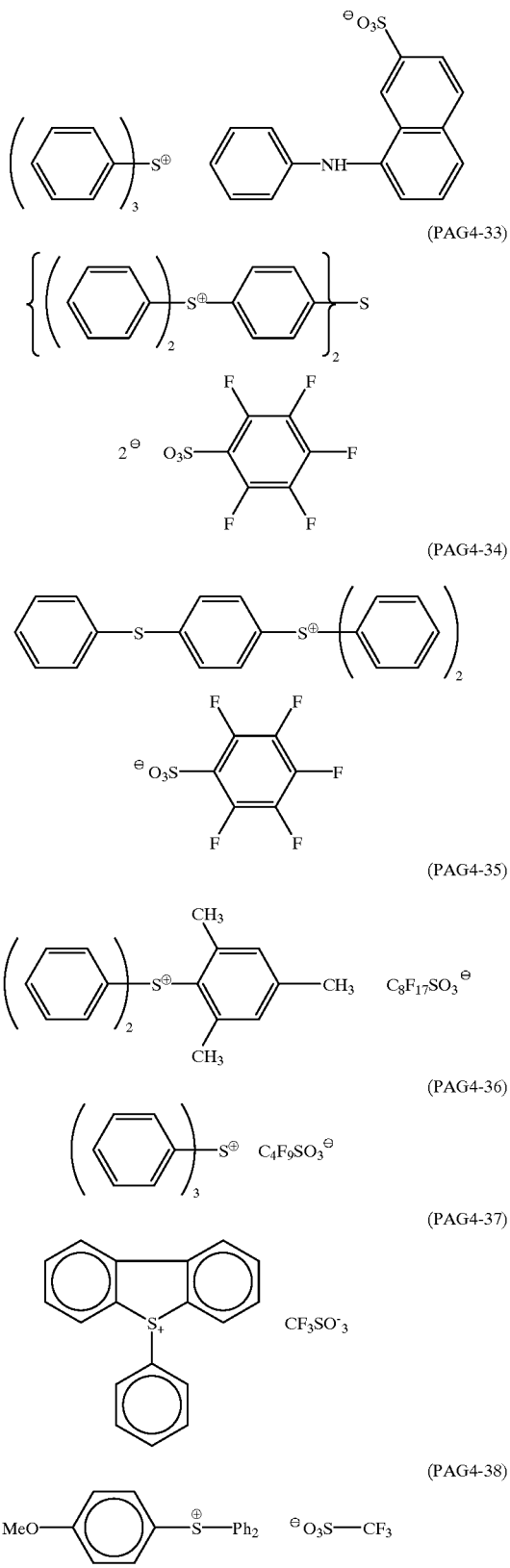

(PAG4-39)
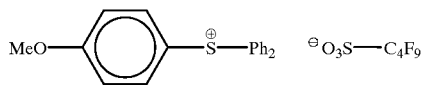

(PAG4-40)
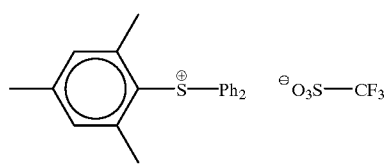

(PAG4-41)
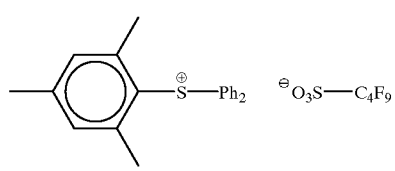

(PAG4-42)
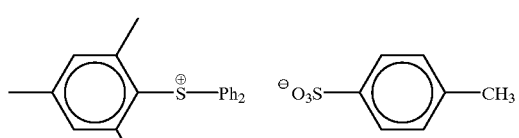

(PAG4-43)
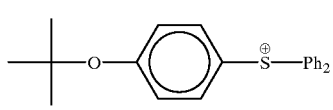

(PAG4-44)
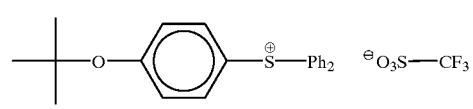

(PAG4-45)
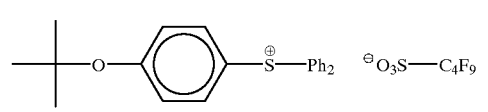

(PAG4-46)
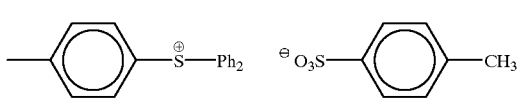

(PAG4-47)
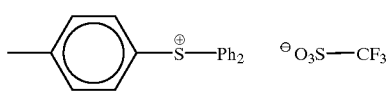

(PAG4-48)
$\phi$—S$^{\oplus}$—Ph$_2$  $^{\ominus}$O$_3$S—C$_4$F$_9$ (PAG4-49)
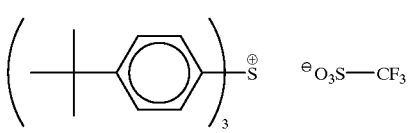

(PAG4-50)
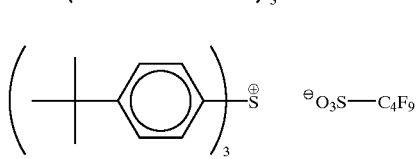

(PAG4-51)
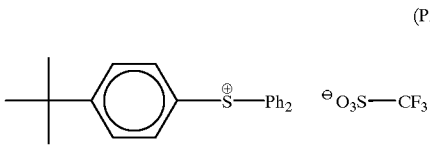

(PAG4-52)
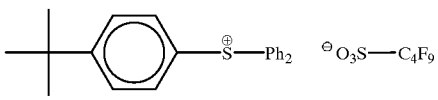

in the above, Ph represents phenyl group.

The onium salts represented by the general formulae (PAG3) and (PAG4) are known. They can be synthesized, for example, by the methods described in, e.g., U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

$$Ar^3—SO_2—SO_2—Ar^4 \quad (PAG5)$$

(PAG6)
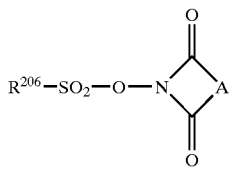

In the formulae, $Ar^3$ and $Ar^4$ each independently represents a substituted or unsubstituted aryl group; $R^{206}$ represents a substituted or unsubstituted alkyl group or aryl group; and A represents a substituted or unsubstituted alkylene group, alkenylene group, or arylene group.

The following compounds show specific examples thereof, but the compounds represented by the general formula (PAG5) or (PAG6) should not be construed as being limited thereto.

(PAG5-1)
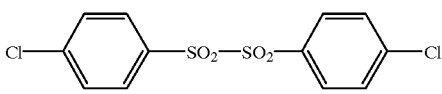

(PAG5-2)
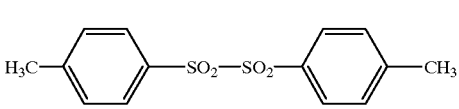

(PAG5-3)
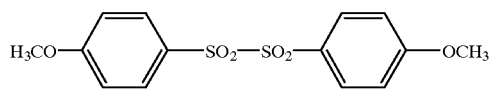
(PAG5-4)
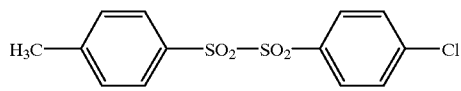
(PAG5-5)
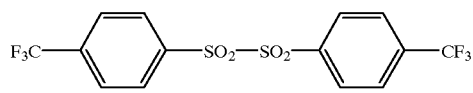
(PAG5-6)
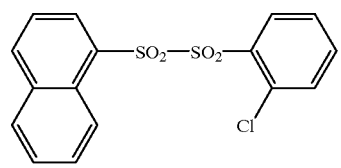
(PAG5-7)
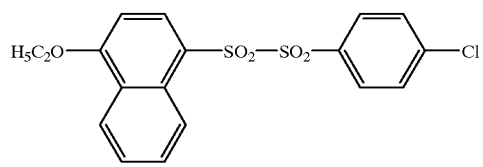
(PAG5-8)
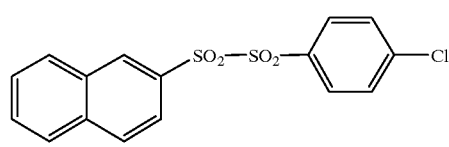
(PAG5-9)
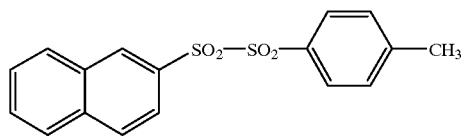
(PAG5-10)
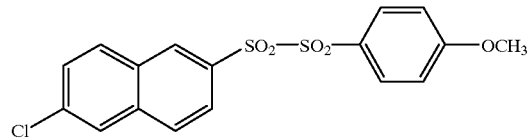
(PAG5-11)
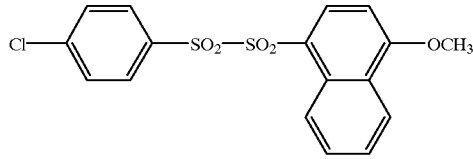
(PAG5-12)
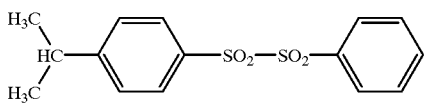
(PAG5-13)
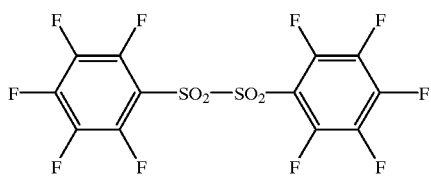
(PAG5-14)
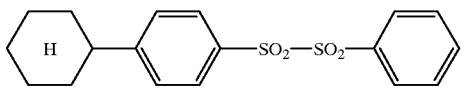
(PAG5-15)
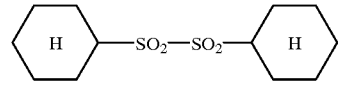
(PAG6-1)
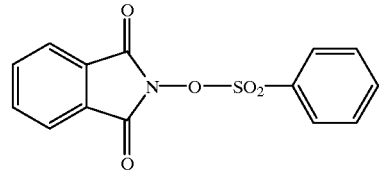
(PAG6-2)
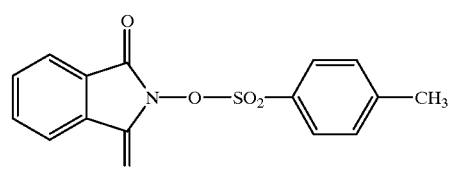
(PAG6-3)
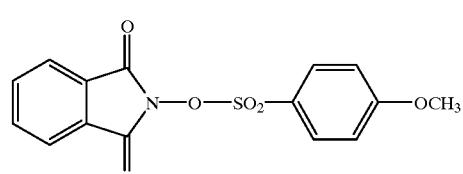
(PAG6-4)
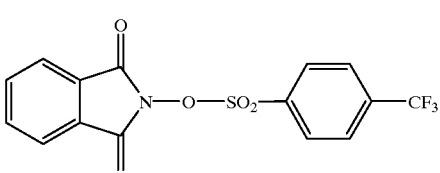

-continued
(PAG6-5)
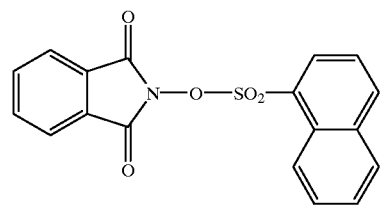
(PAG6-6)
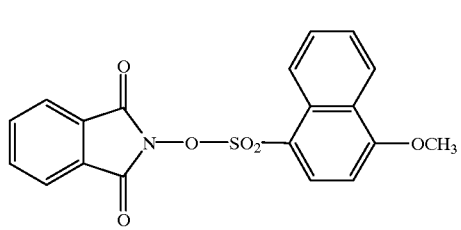
(PAG6-7)
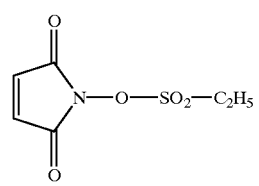
(PAG6-8)
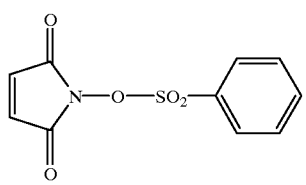
(PAG6-9)
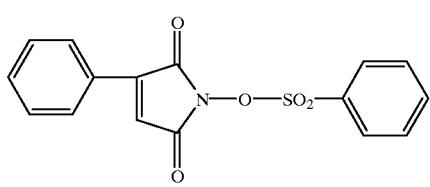
(PAG6-10)
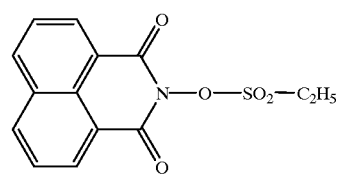
(PAG6-11)
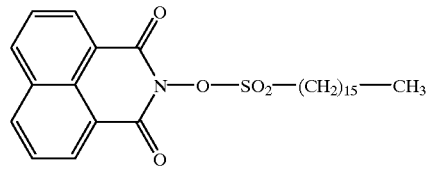
(PAG6-12)
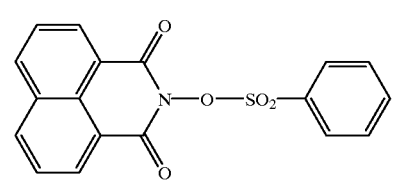
-continued
(PAG6-13)
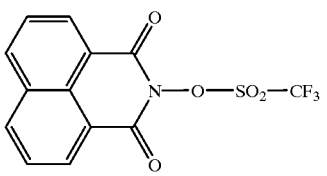
(PAG6-14)
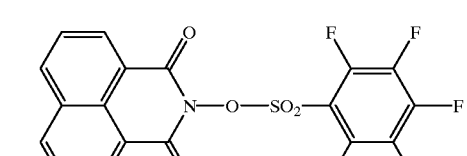
(PAG6-15)
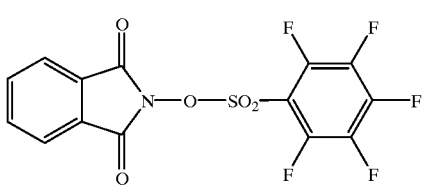
(PAG6-16)
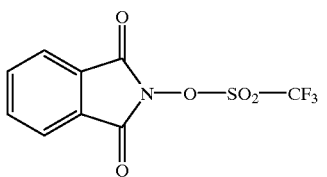
(PAG6-17)
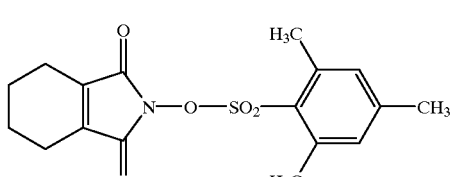
(PAG6-18)
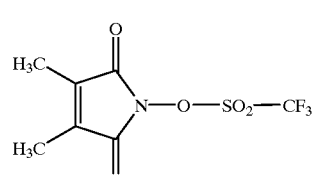
(PAG6-19)
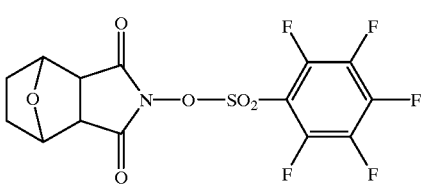
(PAG6-20)
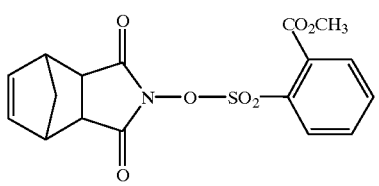

(PAG6-21)
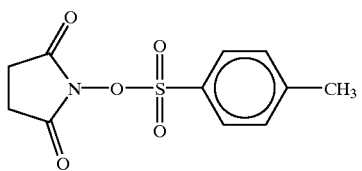

(PAG6-22)
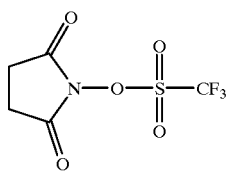

(PAG6-23)
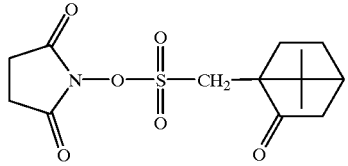

(PAG6-24)
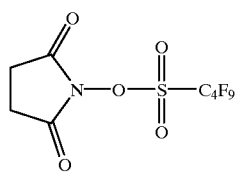

(PAG6-25)
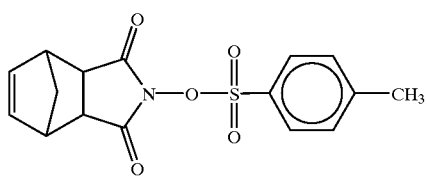

(PAG6-26)
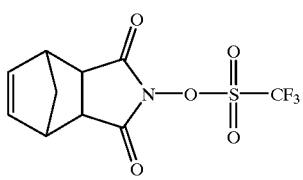

(PAG6-27)
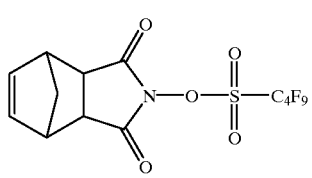

(PAG6-28)
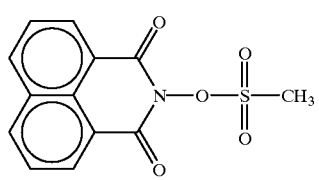

(PAG6-29)
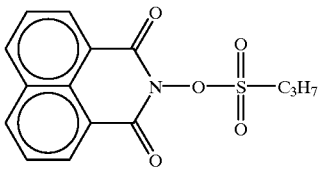

(PAG6-30)
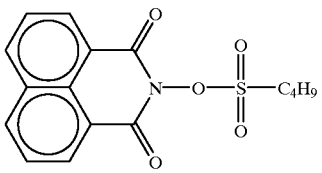

(PAG6-31)
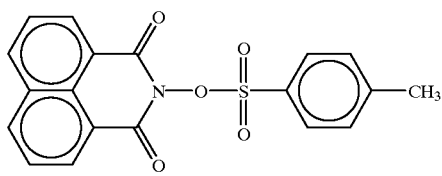

(PAG6-32)
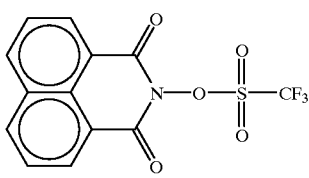

(PAG6-33)
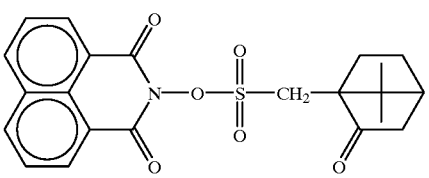

(PAG6-34)
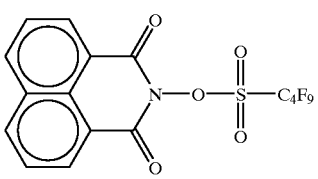

(4) Diazodisulfone derivatives represented by the following general formula (PAG7):

(PAG7)
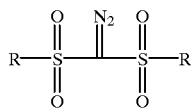

wherein, R represents a linear, branched, or cyclic alkyl group, or an aryl group which may have substituent(s).

The following compounds show specific examples thereof, but the compound represented by the general formula (PAG7) should not be construed as being limited thereto.

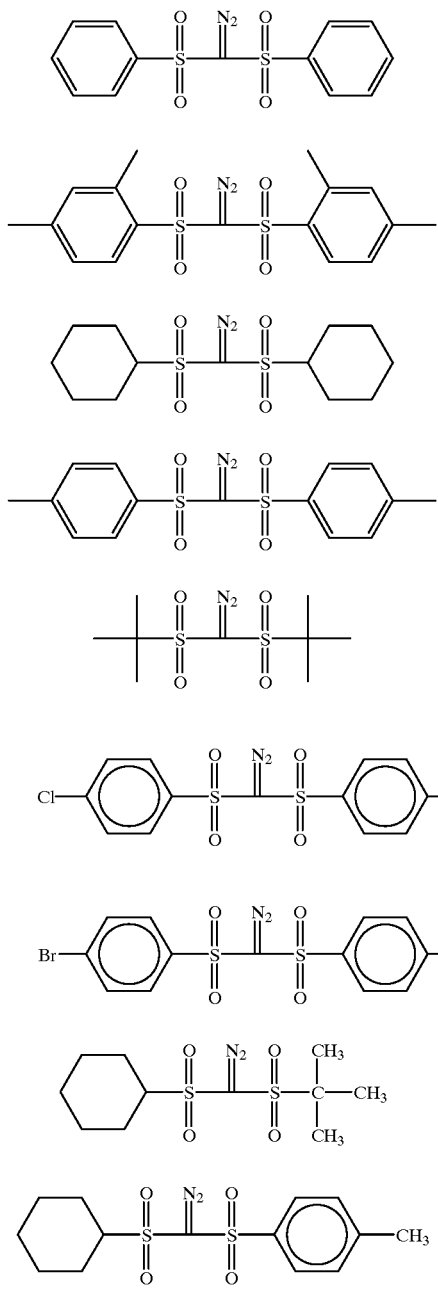

The addition amount of these photo-acid generators is generally from 0.001 to 30% by weight, preferably from 0.3 to 20% by weight, more preferably from 0.5 to 10% by weight, based on the solid content of the composition.

When the addition amount of the photo-acid generator is smaller than 0.001% by weight, sensitivity tends to be reduced. When the addition amount thereof exceeds 30% by weight, the resist comes to show too high light absorption, whereby an impaired profile and a narrowed margin for processing (especially baking) tend to be caused.

[3] (C) Organic Basic Compounds

The preferred organic basic compounds (C) for use in the invention are compounds having stronger basicity than phenol has. More preferred among these are nitrogen-containing basic compounds.

The change of sensitivity with the passage of time is reduced by adding the organic basic compound (C). Examples of the organic basic compound (c) include compounds having the following structures.

(A)

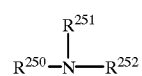

wherein, $R^{250}$, $R^{251}$, and $R^{252}$ each represents hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may be bonded to each other to form a ring.

(B)

(C)

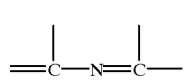

(D)

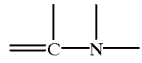

(E)

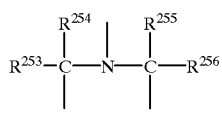

wherein, $R^{253}$, $R^{254}$, $R^{255}$, and $R^{256}$ each independently represents an alkyl group having 1 to 6 carbon atoms.

More preferred organic basic compounds are nitrogen-containing basic compounds having, per one molecule, two or more nitrogen atoms at different chemical environments. Particularly preferred are compounds containing both of a substituted or unsubstituted amino group and a nitrogen-containing ring structure and compounds having an alkylamino group. Preferred examples include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino group, aminoalkyl group, alkylamino groups, aminoaryl groups, arylamino groups, alkyl groups, alkoxy groups, acyl groups, acyloxy groups, aryl groups, aryloxy groups, nitro group, hydroxy group, and cyano group.

Specific examples of the preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 1,4-diazabicyclo[2.2.2]octane, 2,4,5-triphenylimidazole, tertiary morpholines such as N-methylmorpholine, N-ethylmorpholine, N-hydroxyethylmorpholine, N-benzylmorpholine and cyclohexylmorpholinoethylthiourea (CHMETU), hindered amines as described in JP-A-11-52575 (e.g., those described in Paragraph [0005] of the publication). However, the organic basic compounds should not be construed as being limited thereto.

Particularly preferred examples include 1,5-diazabicyclo[4.3.0]non-5-ene, 1,8-diazabicyclo[5.4.0]undec-7-ene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, hindered amines such as bis(1,2,2,6,6-pentamethyl-4-piperidyl) cebacate.

Among them, preferred are 1,5-diazabicyclo[4.3.0]non-5-ene, 1,8-diazabicyclo[5.4.0]undec-7-ene, 1,4-diazabicyclo[2.2.2]octane, 4-dimethylaminopyridine, hexamethylenetetramine, CHMETU, and bis(1,2,2,6,6-pentamethyl-4-piperidyl) cebacate.

These organic basic compounds may be used alone or in combination of two or more thereof. The amount of the organic basic compounds to be used is usually from 0.001 to 10% by weight, preferably from 0.01 to 5% by weight, relative to the solid content of the total photosensitive resin composition. When the amount thereof is smaller than 0.001% by weight, the effects of the addition of the organic basic compound cannot be obtained. On the other hand, when it exceeds 10% by weight, reduced sensitivity and impaired developability at unexposed parts tend to be caused.

[4] (D) Fluorine-type and/or Silicon-type Surfactants

The positive photoresist composition of the invention preferably contains a fluorine-type and/or silicon-type surfactant.

The positive photoresist composition of the invention preferably contains any of a fluorine-type surfactant, a silicon-type surfactant, and a surfactant containing both fluorine atom and silicon atom, or contains two or more thereof.

The incorporation of the acid-decomposable resin and the surfactant into the positive photoresist composition of the invention improves pitch dependency (iso/dense bias).

Examples of the surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988, and U.S. Pat. Nos. 5,405,720, 5,360,692, 5,529,881, 5,296,330, 5,436,098, 5,576,143, 5,294,511, and 5,824,451, or the following commercial surfactants can be used as they are.

Examples of the usable commercial surfactants include fluorine-type surfactants or silicon-type surfactants such as Eftop EF301 and EF303 (products of Shin-Akita Kasei K.K.), Florad FC430 and FC431 (products of Sumitomo 3M Limited), Megafac F171, F173, F176, F189 and R08 (products of Dai-Nippon Ink & Chemicals, Inc.), Surflon S-382, SC101, 102, 103, 104, 105 and 106 (products of Asahi Glass Co., Ltd.), Troysol S-366 (a product of Troy Chemical K.K.). Further, organosiloxane polymers such as KP-341 (produced by Shin-Etsu Chemical Co., Ltd.), may be also used as silicon-type surfactants.

The amount of the surfactant to be added is usually from 0.001 to 2% by weight, preferably from 0.01 to 1% by weight, based on the solid content of the composition of the invention. These surfactants may be added alone or in combination of two or more thereof.

Examples of usable surfactant other than the above include nonionic surfactants such as polyoxyethylene alkyl ethers, e.g., polyoxyethylene lauryl ether, polyoxyethylene stearyl ether, polyoxyethylene cetyl ether, polyoxyethylene oleyl ether; polyoxyethylene alkyl aryl ethers, e.g., polyoxyethylene octyl phenol ether, polyoxyethylene nonyl phenol ether; polyoxyethylene-polyoxypropylene block copolymers; sorbitan fatty acid esters, e.g., sorbitan monolaurate, sorbitan monopalmitate, sorbitan monostearate, sorbitan monooleate, sorbitan trioleate, sorbitan tristearate; and polyoxyethylenesorbitan fatty acid esters, e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate.

The amount of these other surfactants to be added is usually 2 parts by weight or less, preferably 1 part by weight or less, per 100 parts by weight of the solid content of the composition of the invention.

The positive photoresist composition of the invention is applied to a substrate by use of at least one solvent selected from propylene glycol monoalkyl ether acetates such as propylene glycol monomethyl ether acetate and propylene glycol monoethyl ether acetate; propylene glycol monoalkyl ether carboxylates; alkyl lactates such as methyl lactate and ethyl lactate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; 2-heptanone; γ-butyrolactone; alkyl alkoxypropionates such as methyl methoxypropionate and ethyl ethoxypropionate; alkyl pyruvates such as methyl pyruvate and ethyl pyruvate, propyl pyruvate; N-methylpyrrolidone; N,N-dimethylacetamide; dimethyl sulfoxide; esters of acetic acid; aliphatic ketones; ethylene carbonate; propylene carbonate; and the like.

In the invention, the solid mass of the resist composition containing the above each component is used after dissolving it in the above solvent at a concentration of preferably 3 to 25% by weight, more preferably 5 to 22% by weight, further preferably 7 to 20% by weight.

The positive photoresist composition of the invention may further contain compounds of inhibiting the dissolution derived from decomposition by acid, dyes, plasticizers, photosensitizers, compounds promoting the dissolution in a developing solution, and the like, if necessary.

The positive photoresist composition of the invention is applied to a substrate to form a thin film. The thickness of the coated film is preferably form 0.2 to 1.2 μm. In the invention, a commercially available inorganic or organic antireflection film may be used, if necessary.

As the antireflection film, inorganic films such as titanium, titanium dioxide, titanium nitride, chromium oxide, carbon, and α-silicon, and organic films comprising light-absorbers and polymer materials may be used. The former requires facilities such as vapor deposition apparatus, CVD apparatus or sputtering apparatus for film formation. Examples of the organic antireflection film include the one comprising a condensate of a diphenylamine derivative with a formaldehyde-modified melamine resin described in Japanese Patent Publication No. JP-B-7-69611, an alkai-soluble resin, and a light absorber; a reaction product of a maleic anhydride copolymer with a diamine-type light absorber described in U.S. Pat. No. 5,294,680; the one containing a resin binder and a methylol melamine-type thermocrosslinking agent described in JP-A-6-118631; an acrylic resin-type antireflection film having a carboxylic acid group, an epoxy group and a light absorber in the same molecule described in JP-A-6-118656; the one comprising methylol melamine and a benzophenone-type light absorber described in JP-A-8-87115; and the one obtainable by adding a low molecular weight light absorber to a polyvinyl alcohol resin described in JP-A-8-179509.

Further, as the organic antireflection films, DUV30 series and DUV-40 series manufactured by Brewer Science, Inc. and AC-2 and AC-3 manufactured by Shipley Co., Ltd. can be also used.

A satisfactory resist pattern can be obtained by applying the above resist solution on a substrate such as those for use in the production of precision integrated circuit elements (e.g., silicon/silicon dioxide coating) (on a substrate on which the above antireflection film is provided, if necessary) by an appropriate coating means, e.g., a spinner or coater, exposing the coating to light through a mask, and then baking and developing the coating. The exposure light is preferably a light having a wavelength of 150 to 250 nm. Examples thereof include KrF excimer laser (248 nm), ArF excimer laser (193 nm), $F_2$ excimer laser (157 nm), X-ray, and electron beam.

As a developing solution, an aqueous solution of an alkali can be used. Examples of the alkali include inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide, tetraethylammonium hydroxide; and cyclic amines such as pyrrole and piperidine.

Further, it is also possible to use the alkaline aqueous solution with adding an appropriate amount of an alcohol or a surfactant.

EXAMPLES

The present invention will be explained below in more detail by reference to Examples, but the invention should not be construed as being limited thereto.
Synthesis of Resins

Synthetic Example (1)
Synthesis of the Above-exemplified Resin (1) of the Component (A)

Norborne, a corresponding lactone acrylate, and maleic anhydride were charged into a reaction vessel in a molar ratio of 40/20/40 and dissolved in methyl ethyl ketone to prepare a solution having the solid content of 60%. This solution was heated to 70° C. under a stream of nitrogen. After the solution temperature was stabilized, a radical initiator V-601 produced by Wako Pure Chemical Industries, Ltd. was added thereto in an amount of 5 mol % to start the reaction. After 8 hours of the heating, the reaction mixture was diluted three times with methyl ethyl ketone, and then, poured into a large amount of hexane to precipitate white powder. The powder thus precipitated was filtered off and dried to obtain aimed Resin 1-1.

The analysis of the molecular weight of resulting Resin 1-1 on GPC showed that the weight average molecular weight was 10200 based on polystyrene standard. The composition of Resin 1-1 was determined from the NMR spectrum that the molar ratio of norbornene/ethoxymethyl acrylate/maleic anhydride was 40/19/41.

Resins 1-2 to 1-12 were synthesized in similar manners to Synthetic Example (1). The composition ratios and the weight average molecular weights (Mw) of the resins are shown in Table 1.

TABLE 1

| Resin | Norbornene | Lactone | Acid anhydride | Fourth component | Mw |
|---|---|---|---|---|---|
| 1-2 | 41 | 17 | 42 | | 10900 |
| 1-3 | 40 | 20 | 40 | | 9500 |
| 1-4 | 40 | 8 | 41 | 11 | 9600 |
| 1-5 | 41 | 18 | 41 | | 10300 |
| 1-6 | 42 | 6 | 42 | 10 | 10400 |
| 1-7 | 38 | 11 | 39 | 12 | 9800 |
| 1-8 | 42 | 6 | 42 | 10 | 9700 |
| 1-9 | 32 | 34 | 34 | | 10100 |
| 1-10 | 42 | 6 | 42 | 10 | 10000 |
| 1-11 | 42 | 7 | 42 | 9 | 9300 |
| 1-12 | 42 | 12 | 42 | 4 | 8900 |

Examples 1-1 to 1-16 and Comparative Examples 1-1 and 1-2

Preparation of Positive Photoresist Compositions and Evaluation

Ten grams of each resin synthesized in above Synthetic Examples and shown in Table 2 was mixed with a photo-acid generator shown in Table 2, 0.1 mg of an organic basic compound (amine) shown in Table 2, and optionally 0.1 g of a surfactant shown in Table 2. The mixture was dissolved in propylene glycol monomethyl ether acetate such that the resulting solution had the total solid content of 14% by weight and then, the solution was filtered through a 0.1 $\mu$m microfilter. Thus, positive photoresist compositions of Examples 1-1 to 1-16 were prepared.

Also, as Comparative Example 1-1, a positive photoresist composition was prepared in a similar manner to above Examples 1-1 to 1-16 with the exception that the binder described in Example 3-(A) of JP-A-10-130340 was used as the resin R1.

Further, as Comparative Example 1-2, a positive photoresist composition was prepared in a similar manner to above Examples 1-1 to 1-16 with the exception that the four-component binder described in Example 7 of JP-A-10-10739 was used as the resin R2.

The amines used are shown as follows:
1: 1,5-diazabicyclo[4.3.0]-5-nonene (DBN)
2: bis(1,2,2,6,6-pentamethyl-4-piperidyl) cebacate.

The surfactants used are shown as follows:
W1: Megafac F176 (a product of Dai-Nippon Ink & Chemicals, Inc.
W2: Megafac R08 (a product of Dai-Nippon Ink & Chemicals, Inc.
W3: polysiloxane polymer KP-341) (a product of Shin-Etsu Chemical Co., Ltd.)
W4: polyoxyethylene nonylphenyl ether
W5: Troysol S-366 (a product of Troy Chemical K.K.)

TABLE 2

| Example | Resin | Photo-acid generator | Organic basic compd. | Surfactant |
|---|---|---|---|---|
| 1-1 | 1-1 | PAG4-36 = 0.2 g | 1 | W1 |
| 1-2 | 1-2 | PAG4-5/PAG7-1 = 0.18 g/0.5 g | 2 | W2 |
| 1-3 | 1-3 | PAG4-37 = 0.19 g | 1 | W3 |
| 1-4 | 1-4 | PAG4-38 = 0.20 g | 2 | W3 |
| 1-5 | 1-5 | PAG4-39/PAG7-5 = 0.17 g/0.6 g | 1 | W5 |
| 1-6 | 1-6 | PAG4-35/PAG4-5 = 0.1 g/0.1 g | 2 | W5 |
| 1-7 | 1-7 | PAG4-39 = 0.20 g | 1 | W5 |
| 1-8 | 1-8 | PAG4-36/PAG7-3 = 0.2 g/0.5 g | 2 | W5 |
| 1-9 | 1-9 | PAG4-37/PAG7-3 = 0.18 g/0.4 g | 1 | W5 |
| 1-10 | 1-10 | PAG4-40 = 0.22 g | 2 | W1 |
| 1-11 | 1-11 | PAG4-38/PAG7-5 = 0.19 g/0.5 g | 2 | W1 |
| 1-12 | 1-12 | PAG4-40/PAG7-5 = 0.24 g/0.4 g | 1 | W2 |
| 1-13 | 1-1 | PAG3-21 = 0.24 g | 1 | W3 |
| 1-14 | 1-2 | PAG4-5 = 0.15 g | 1 | W4 |
| 1-15 | 1-6 | PAG4-5/PAG6-19 = 0.1 g/0.05 g | 1 | none |
| 1-16 | 1-10 | PAG4-6 = 0.2 g | none | W5 |
| Comparative Example 1-1 | R1 | PAG4-5 = 0.2 g | none | none |
| Comparative Example 1-2 | R2 | PAG3-23 = 0.2 g | none | none |

Evaluation Test

Each of the resulting positive photoresist solutions was coated on a silicon wafer by means of a spin coater, and dried at 140° C. for 90 seconds to form a positive photoresist film having a thickness of about 0.4 μm. Each coating was exposed with ArF excimer laser (ArF stepper manufactured by ISI Co., of wavelength 193 nm, NA=0.6). After the exposure, the coating was heated at 150° C. for 90 seconds. Thereafter, it was developed with a 2.38% aqueous solution of tetramethylammonium hydroxide, and rinsed with distilled water to obtain a resist pattern profile.

Exposure margin and edge roughness were evaluated on these samples as shown below. The evaluation results are shown in Table 3.

[Exposure margin]: As the index of exposure margin was used the variation (%) of line width of the pattern obtained when the exposure capable of reproducing mask line width of a 0.14 μm isolated line was changed in an amount of ±5%. The smaller this value is, the more it is preferred.

[Edge roughness]: Edge roughness was determined as the edge roughness of a 0.14 μm line and space (line/space=1/1.2) pattern by means of an end-measuring scanning electron microscope (SEM). A line pattern edge was detected at two or more positions in a measuring monitor and the distribution (3σ) of variations at the detecting positions was used as the index of edge roughness. The smaller this value is, the more it is preferred.

TABLE 3

| Example | Exposure margin (%) | Edge roughness (mm) |
|---|---|---|
| 1-1 | 5 | 7 |
| 1-2 | <5 | 6 |
| 1-3 | 5 | 7 |
| 1-4 | 7 | 8 |
| 1-5 | 6 | 8 |
| 1-6 | 5 | 7 |
| 1-7 | 5 | 7 |
| 1-8 | <5 | 6 |
| 1-9 | 6 | 8 |
| 1-10 | 5 | 7 |
| 1-11 | <5 | 6 |
| 1-12 | <5 | 8 |
| 1-13 | 5 | 8 |
| 1-14 | 6 | 8 |
| 1-15 | 6 | 8 |
| 1-16 | 6 | 10 |
| Comparative Example 1-1 | 25 | 18 |
| Comparative Example 1-2 | 30 | 23 |

As apparent from the results in Table 3, the positive photoresist composition of the invention exhibits satisfactory exposure margin and edge roughness toward the exposure with a light having wavelength of 193 nm.

Synthetic Example (2)

Synthesis of Resin (2-1)

Norborne, t-butyl acrylate, maleic anhydride, and a lactone monomer constituting the above-exemplified Resin (1) of the component (A1) were charged into a reaction vessel in a molar ratio of 35/20/35/10 and dissolved in methyl ethyl ketone to prepare a solution having the solid content of 60%. This solution was heated to 60° C. under a stream of nitrogen. After the solution temperature was stabilized, a radical initiator V-601 produced by Wako Pure Chemical Industries, Ltd. was added thereto in an amount of 1.5 mol % to start the reaction. After 10 hours of the heating, the reaction mixture was diluted twice with methyl ethyl ketone, and then, poured into a five-times amount of a mixed solvent of tert-butyl methyl ether/hexane=½ (by weight) to precipitate white powder. The powder thus precipitated was filtered off and dried to obtain aimed Resin (2-1).

The analysis of the molecular weight of resulting Resin (2-1) on GPC showed that the weight average molecular weight was 15800 based on polystyrene standard. The composition of Resin (2-1) was determined from the NMR spectrum that the molar ratio of Norborne/t-butyl acrylate/maleic anhydride/a lactone monomer was 31/19/44/6.

Resins (2-2) to (2-9) were synthesized in similar manners to Synthetic Example (2). The composition ratios and the weight average molecular weights (Mw) of the resins are shown in Table 4.

TABLE 4

| Resin | Norbornene | (Meth)-acrylate | Monomer of (NIII) (anhydride) | Lactone monomer | Mw |
|---|---|---|---|---|---|
| 2-2 | 28 | 25 | 40 | 7 | 15500 |
| 2-3 | 28 | 22 | 40 | 6/2/2 | 15900 |
| 2-4 | 31 | 29 | 34 | 6 | 14900 |
| 2-5 | 29 | 24 | 38 | 9 | 15400 |
| 2-6 | 32 | 21 | 38 | 3/3/3 | 16300 |
| 2-7 | 30 | 18 | 44 | 8 | 16200 |
| 2-8 | 32 | 21 | 37 | 10 | 16400 |
| 2-9 | 29 | 22 | 37 | 7/3/2 | 15700 |

Examples 2-1 to 2-18 and Comparative Example 2-1

Preparation of Positive Photoresist Compositions and Evaluation

Two grams of each resin synthesized in above Synthetic Examples and shown in Table 5 was mixed with 110 mg of a photo-acid generator, 5 mg of an organic basic compound, and 5 mg of a surfactant shown in Table 5. The mixture was dissolved in a solvent shown in Table 5 such that the resulting solution had the total solid content of 10% by weight and then, the solution was filtered through a 0.1 μm microfilter. Thus, positive photoresist compositions of Examples 2-1 to 2-18 were prepared.

Also, as Comparative Example 2-1, a positive photoresist composition was prepared in a similar manner to above Example 2-1 with the exception that the above resin, photo-acid generator and solvent each shown in Table 5 were used.

The solvents are shown as follows:
S1: propylene glycol monomethyl ether acetate
S2: butyl acetate
S3: 2-heptanone

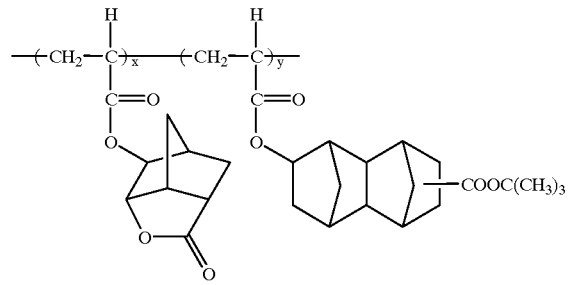

x=y=0.5 weight average molecular weight 13,000

TABLE 5

| Example | Resin component | Photo-acid generator | Solvent | Surfactant | Organic basic compd. |
|---|---|---|---|---|---|
| 2-1 | Resin(1) | PAG4-52 43 mg | S1/S2 = 60/40 | W-5 | 1 |
| 2-2 | Resin(2) | PAG4-36 41 mg | S1/S4 = 90/10 | W-4 | 2 |
| 2-3 | Resin(3) | PAG4-39 42 mg | S1/S5 = 70/30 | W-3 | 3 |
| 2-4 | Resin(4) | PAG4-35 45 mg | S3/S2 = 60/40 | W-2 | 2 |
| 2-5 | Resin(5) | PAG4-48 44 mg | S1/S7 = 88/12 | W-1 | 1 |
| 2-6 | Resin(6) | PAG4-39/7-3 = 40/20 mg | S1/S6 = 90/10 | W-2 | 2 |
| 2-7 | Resin(7) | PAG4-36/3-25 = 40/3 mg | S1/S2/S8 = 70/25/5 | W-3 | 1 |
| 2-8 | Resin(8) | PAG4-6 47 mg | S1/S5/S6 = 75/20/5 | W-3 | 2 |
| 2-9 | Resin(9) | PAG3-21/4-48 = 6/38 mg | S3/S4/S7 = 80/10/10 | W-5 | 3 |
| 2-10 | Resin(1) | PAG4-34 45 mg | S1 | W-5 | 3 |
| 2-11 | Resin(2) | PAG4-7/7-5 = 35/10 mg | S1 | W-5 | 3 |
| 2-12 | Resin(3) | PAG6-19/4-29 = 6/40 mg | S1 | W-3 | 2 |
| 2-13 | Resin(4) | PAG4-36/7-5 = 43/10 mg | S1 | W-2 | 1 |
| 2-14 | Resin(5) | PAG4-39/7-3 = 38/10 mg | S1 | W-1 | 2 |
| 2-15 | Resin(6) | PAG6-24 90 mg | S1 | W-2 | 3 |
| 2-16 | Resin(7) | PAG4-52/6-27 = 30/20 mg | S1 | W-3 | 1 |
| 2-17 | Resin(8) | PAG4-6/4-36 = 10/30 mg | S1 | W-5 | 2 |
| 2-18 | Resin(9) | PAG4-50 40 mg | S1 | — | — |
| Comparative Example 2-1 | Resin(R) | PAG4-5 | S1 | — | — |

S4: propylene glycol monomethyl ether

S5: ethoxyethyl propionate

S6: γ-butyrolactone

S7: ethylene carbonate

S8: propylene carbonate.

In the case of using a mixed solvent, the ratio is indicated by weight.

The surfactants are shown as follows:

W-1: Megafac F176 (a product of Dai-Nippon Ink & Chemicals, Inc.) (fluorine-type)

W-2: Megafac R08 (a product of Dai-Nippon Ink & Chemicals, Inc.) (fluorine-type and silicon-type)

W-3: polysiloxane polymer KP-341 (a product of Shin-Etsu Chemical Co., Ltd.)

W-4: polyoxyethylene nonylphenyl ether

W-5: Troysol S-366 (a product of Troy Chemical K.K.).

The organic basic compounds are shown as follows:

1: DBU (1,8-diazabicyclo[5.4.0]-7-undecene)

2: 4-DMAP (4-dimethylaminopyridine)

3: TPI (2,4,5-triphenylimidazole).

The resin used in Comparative Example, Resin R: the resin having the following structure which was used in Example 20 of JP-A-2000-26446.

Evaluation Test

Each of the resulting positive photoresist solutions prepared in the above was coated on a silicon wafer, and baked at 140° C. for 90 seconds to form a film having a thickness of 0.20 μm.

Each wafer thus obtained was exposed with changing exposure by loading a resolving power mask on an ArF excimer laser stepper (an ArF exposing machine 9300 manufactured by ISI Co.). Thereafter, the wafer was heated at 155° C. for 90 seconds in a clean room. Then, it was developed with a developing solution (2.38% by weight) of tetramethylammonium hydroxide for 60 seconds, rinsed with distilled water, and dried to obtain a pattern.

[Line edge roughness]: Over a 5 μm range of the edge in a longitudinal direction of a 140 nm line pattern obtained by minimum exposure capable of reproducing the 140 nm line pattern on the mask, the distances from the standard line where the edge must be exist were measured at 50 points with Electron beam Length Measuring Equipment, S-8840 manufactured by Hitachi, Ltd. From the date, standard deviation was determined to calculate 3σ. The smaller this value is, the more it is preferred.

[Developing defects]: Each resist film was coated in a thickness of 0.5 μm on a 6-inch bare Si substrate, and dried at 140° C. for 60 seconds on a vacuum-absorption-type hot plate. Then, the film was exposed with an ArF excimer laser stepper (ArF exposing machine 9300 manufactured by ISI Co.) through a test mask of 0.20 μm contact hole pattern (Hole Duty ratio=1:3). After the exposure, the film was heated at 155° C. for 90 seconds. Thereafter, it was developed under paddling with 2.38% by weight of TMAH (aqueous solution of tetramethylammonium hydroxide) for 60 seconds, washed with pure water for 30 seconds, and dried under spinning. The number of developing defects was measured on the sample thus obtained by means of KLA-2112 machine manufactured by KLA-Tencor Corporation and the primary data was used as the number of developing defects.

These evaluation results are shown in Table 6.

TABLE 6

| Example | Edge roughness (mm) | Number of developing defects |
|---|---|---|
| 2-1 | 10 | 35 |
| 2-2 | 12 | 45 |
| 2-3 | 10 | 35 |
| 2-4 | 10 | 35 |
| 2-5 | 11 | 30 |
| 2-6 | 11 | 30 |
| 2-7 | 9 | 25 |
| 2-8 | 9 | 25 |
| 2-9 | 9 | 25 |
| 2-10 | 12 | 40 |
| 2-11 | 12 | 45 |
| 2-12 | 12 | 40 |
| 2-13 | 12 | 40 |
| 2-14 | 12 | 40 |
| 2-15 | 12 | 50 |
| 2-16 | 12 | 45 |
| 2-17 | 12 | 40 |
| 2-18 | 13 | 70 |
| Comparative Example 2-1 | 18 | 1700 |

As shown in Table 6, the positive photoresist composition of the invention exhibited excellent performance on all the evaluated articles.

Synthetic Example (3)
Synthesis of Resin (3-1)

Norborne, t-butyl acrylate, maleic anhydride, and a lactone monomer of the invention constituting the above-exemplified Resin (1) of the component (A2) were charged into a reaction vessel in a molar ratio of 32.5/20/32.5/15 and dissolved in methyl ethyl ketone to prepare a solution having the solid content of 60%. This solution was heated to 60° C. under a stream of nitrogen. After the solution temperature was stabilized, a radical initiator V-601 produced by Wako Pure Chemical Industries, Ltd. was added thereto in an amount of 1.5 mol % to start the reaction. After 10 hours of the heating, the reaction mixture was diluted twice with methyl ethyl ketone, and then, poured into a five-times amount of a mixed solvent of tert-butyl methyl ether/hexane=⅓ to precipitate white powder. The powder thus precipitated was again dissolved in methyl ethyl ketone and poured into a five-times amount of a mixed solvent of tert-butyl methyl ether/hexane=⅓ to precipitate white powder. The white powder was filtered off and dried to obtain aimed Resin (3-1).

The analysis of the molecular weight of resulting Resin (3-1) on GPC showed that the weight average molecular weight was 16400 based on polystyrene standard. The composition of Resin (3-1) was determined from the NMR spectrum that the molar ratio of Norborne/t-butyl acrylate/maleic anhydride/a lactone monomer of the invention was 27/18/44/11.

Resins (3-2) to (3-9) were synthesized in similar manners. The composition ratios and the weight average molecular weights (Mw) of the resins are shown in Table 7.

TABLE 7

| Resin | Norbornene | (Meth)-acrylate | Monomer of (NIII) (anhydride) | Lactone monomer | Mw |
|---|---|---|---|---|---|
| 3-2 | 29 | 26 | 39 | 6 | 16100 |
| 3-3 | 28 | 24 | 40 | 8 | 15600 |
| 3-4 | 28 | 25 | 37 | 10 | 16700 |
| 3-5 | 29 | 25 | 38 | 4/4 | 16300 |
| 3-6 | 31 | 23 | 39 | 7 | 16600 |
| 3-7 | 26 | 24 | 36 | 14 | 15900 |
| 3-8 | 30 | 22 | 39 | 9 | 15600 |
| 3-9 | 30 | 24 | 36 | 10 | 16200 |

Examples 3-1 to 3-18 and Comparative Example 3-1

Preparation of Positive Photoresist Compositions and Evaluation

Two grams of each resin synthesized in above Synthetic Examples, a photo-acid generator (the amount was shown in Table 7), 5 mg of a surfactant, and 5 mg of an organic basic compound shown in Table 8 were mixed. The mixture was dissolved in a solvent shown in Table 8 such that the resulting solution had the total solid content of 10% by weight and then, the solution was filtered through a 0.1 μm microfilter. Thus, positive photoresist compositions of Examples 3-1 to 3-18 were prepared.

Also, as Comparative Example 3-1, a positive photoresist composition was prepared similarly with the exception that the resin, photo-acid generator and solvent shown in Table 8 were used.

The solvents are shown as follows:

S1: propylene glycol monomethyl ether acetate

S2: ethyl lactate

S3: butyl acetate

S4: 2-heptanone

S5: propylene glycol monomethyl ether

S6: ethyl(3-ethoxy) propionate

S7: γ-butyrolactone

S8: ethylene carbonate

S9: propylene carbonate.

The surfactants are shown as follows:

W-1: Megafac F176 (a product of Dai-Nippon Ink & Chemicals, Inc.) (fluorine-type)

W-2: Megafac R08 (a product of Dai-Nippon Ink & Chemicals, Inc.) (fluorine-type and silicon-type)

W-3: polysiloxane polymer KP-341 (a product of Shin-Etsu Chemical Co., Ltd.)

W-4: polyoxyethylene nonylphenyl ether

W-5: Troysol S-366 (a product of Troy Chemical K.K.).

The organic basic compounds are shown as follows:

1: DBU (1,8-diazabicyclo[5.4.0]-7-undecene)

2: 4-DMAP (4-dimethylaminopyridine)

3: TPI (2,4,5-triphenylimidazole).

The resin used in Comparative Example 3-1, Resin R: the copolymer 3 synthesized in Example of JP-A-2000-22294 (the structure is shown below).

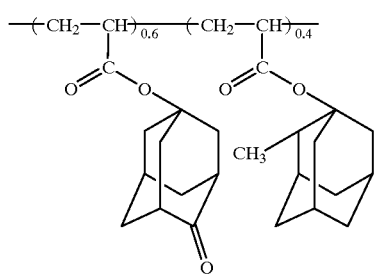

stepper (ArF exposing machine 9300 manufactured by ISI Co.) through a test mask of 0.20 μm contact hole pattern (Hole Duty ratio=1:3). After the exposure, the film was heated at 135° C. for 90 seconds. Thereafter, it was developed under paddling with 2.38% by weight of TMAH (aqueous solution of tetramethylammonium hydroxide) for 60 seconds, washed with pure water for 30 seconds, and dried under spinning. The number of developing defects was measured on the sample thus obtained by means of KLA-2112 machine manufactured by KLA-Tencor Corporation and the primary data were used as the number of developing defects.

TABLE 8

| Example | Resin component | Photo-acid generator | Solvent | Surfactant | Organic basic compd. |
|---|---|---|---|---|---|
| 3-1 | Resin(1) | PAG4-50 42 mg | S1/S2 = 90/10 | W-5 | 1 |
| 3-2 | Resin(2) | PAG4-7 48 mg | S1/S3 = 70/30 | W-1 | 2 |
| 3-3 | Resin(3) | PAG4-36 40 mg | S1/S6 = 70/30 | W-3 | 3 |
| 3-4 | Resin(4) | PAG4-39 38 mg | S1/S7 = 90/10 | W-2 | 2 |
| 3-5 | Resin(5) | PAG4-38/7-5 = 39/10 mg | S1/S8 = 88/12 | W-1 | 1 |
| 3-6 | Resin(6) | PAG4-39/7-3 = 40/15 mg | S1/S4 = 70/30 | W-2 | 2 |
| 3-7 | Resin(7) | PAG4-5/PAG4-6 = 30/5 mg | S1/S5 = 85/15 | W-3 | 1 |
| 3-8 | Resin(8) | PAG4-41 50 mg | S1/S3/S7 = 60/35/5 | W-3 | 2 |
| 3-9 | Resin(9) | PAG4-45 46 mg | S1/S6/S9 = 75/20/5 | W-5 | 3 |
| 3-10 | Resin(1) | PAG4-48/6-15 = 30/6 mg | S1 | W-5 | 3 |
| 3-11 | Resin(2) | PAG4-52 45 mg | S1 | W-4 | 3 |
| 3-12 | Resin(3) | PAG3-18/PAG4-50 = 5/40 mg | S1 | W-3 | 2 |
| 3-13 | Resin(4) | PAG4-52/6-20 = 45/6 mg | S1 | W-2 | 1 |
| 3-14 | Resin(5) | PAG4-52 42 mg | S1 | W-1 | 2 |
| 3-15 | Resin(6) | PAG4-48/6-19 = 36/15 mg | S1 | W-2 | 3 |
| 3-16 | Resin(7) | PAG4-52/PAG6-27 = 40/8 mg | S1 | W-3 | 1 |
| 3-17 | Resin(8) | PAG4-34 40 mg | S1 | W-5 | 2 |
| 3-18 | Resin(9) | PAG4-5 40 mg | S1 | — | — |
| Comparative Example | | | | | |
| 3-1 | Resin(R) | PAG4-5 40 mg | S1 | — | — |

Evaluation Test

Each of the resulting positive photoresist solutions prepared in the above was coated on a silicon wafer, and baked at 130° C. for 90 seconds to form a film having a thickness of 0.20 μm.

Each wafer thus obtained was exposed with changing exposure by loading a resolving power mask on an ArF excimer laser stepper (an ArF exposing machine 9300 manufactured by ISI Co.). Thereafter, the wafer was heated at 135° C. for 90 seconds in a clean room. Then, it was developed with a developing solution (2.38% by weight) of tetramethylammonium hydroxide for 60 seconds, rinsed with distilled water, and dried to obtain a pattern.

[Line edge roughness]: Over a 5 μm range of the edge in a longitudinal direction of a 140 nm line pattern obtained by minimum exposure capable of reproducing the 140 nm line pattern on the mask, the distances from the standard line where the edge must be exist were measured at 50 points with S-8840 manufactured by Hitachi Ltd. From the date, standard deviation was determined to calculate 3σ. The smaller this value is, the more it is preferred.

[Developing defects]: Each resist film was coated in a thickness of 0.5 μm on a 6-inch bare Si substrate, and dried at 130° C. for 60 seconds on a vacuum-absorption-type hot plate. Then, the film was exposed with an ArF excimer laser These evaluation results are shown in Table 9.

TABLE 9

| Example | Edge roughness (mm) | Number of developing defects |
|---|---|---|
| 3-1 | 9 | 35 |
| 3-2 | 8 | 30 |
| 3-3 | 8 | 30 |
| 3-4 | 9 | 25 |
| 3-5 | 9 | 30 |
| 3-6 | 7 | 30 |
| 3-7 | 8 | 32 |
| 3-8 | 7 | 20 |
| 3-9 | 7 | 21 |
| 3-10 | 9 | 42 |
| 3-11 | 11 | 43 |
| 3-12 | 10 | 44 |
| 3-13 | 9 | 41 |
| 3-14 | 10 | 40 |
| 3-15 | 9 | 40 |
| 3-16 | 9 | 41 |
| 3-17 | 10 | 39 |
| 3-18 | 12 | 55 |
| Comparative Example | | |
| 3-1 | 19 | 650 |

As shown in Table 9, the positive photoresist composition of the invention exhibited reduced line edge roughness and occurrence of developing defects.

The invention can provide a positive photoresist composition exhibiting reduced line edge roughness and occurrence of developing defects.

Furthermore, it can be provide a positive photoresist composition exhibiting an improving effect on exposure margin, especially exposure margin of an isolated line, i.e., small variation of line width of an isolated line when light exposure is changed.

While the invention has been described in detail and with reference to specific embodiments thereof, it will be apparent to one skilled in the art that various changes and modifications can be made therein without departing from the spirit and scope thereof.

This application is based on Japanese patent applications No. 2000-115497 filed on Apr. 17, 2000, No. 2000-215574 filed on Jul. 17, 2000 and No. 2000-231670 filed on Jul. 31, 2000, the entire contents of which incorporated herein by reference.

What is claimed is:

1. A positive photoresist composition comprising:

(A1) a resin which contains a repeating unit represented by the following general formula (I), a repeating unit represented by the following general formula (NII) and a re eating unit having a group represented by any of the following general formulae (I-1) to (I-4), and whose dissolving rate toward an alkaline developing solution is increased by the action of an acid, and (B) a compound which generates an acid upon irradiation with an actinic ray or a radiation,

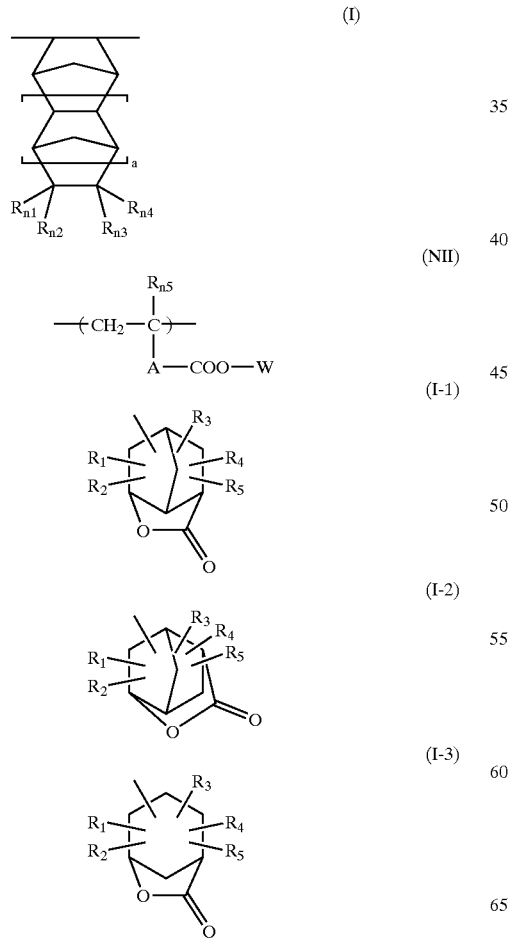

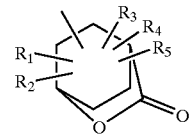

wherein in the formula (I), $Rn_1$ to $Rn_4$ each represents a hydrogen atom or an alkyl group which may have one or more substituents; and a is 0 or 1;

in the formula (NII), $Rn_5$ represents a hydrogen atom or a methyl group; A represents one group or a combination of two or more groups each selected from the group consisting of a single bond, an alkylene group, a cycloalkylene group, an ether group, a thioether group, a carbonyl group and an ester group; W represents a group represented by —C(Rna)(Rnb)(Rnc) or a group represented by —CH(Rnd)—O—Rne, wherein Rna, Rnb, and Rnc each represents a linear or branched alkyl group having 1 to 20 carbon atoms or an alicyclic hydrocarbon group which may have a halogen atom, an alkyl group, an alkoxy group, an alkoxycarbonyl group, an acyl group or an acyloxy group as a substituent, provided that Rna and Rnb may be bon ed to each other to form an alicyclic ring together with the carbon atom to which the groups are commonly attached and, in this case, Rnc is an alkyl group having 1 to 4 carbon atoms; Rnd represents a hydrogen atom or an alkyl group; Rne represents a linear or branched alkyl group having 1 to 20 carbon atoms or an alicyclic hydrocarbon group which may have a halogen atom, an alkyl group, an alkoxy group an alkoxycarbonyl group, an acyl group or an acyloxy group as a substituent;

in the general formulae (I-1) to (I-4), $R_1$ to $R_5$ each independently represents a hydrogen atom, or an alkyl group, a cycloalkyl group or an alkenyl group which may have one or more substituents, and two of $R_1$ to $R_5$ may be bonded to each other to form a ring.

2. The positive photoresist composition according to claim 1, wherein the above resin (A1) further contains a repeating unit represented by the following general formula (NIII),

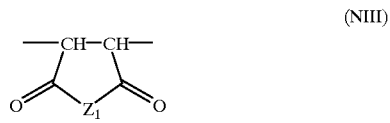

wherein $Z_1$ represents —O— or —N(Rn$_6$)—, wherein Rn$_6$ represents a hydrogen atom, an alkyl group, a haloalkyl group, a hydroxyl group or —OSO$_2$—Rn$_7$, and Rn$_7$ represents an alkyl group, a haloalkyl group, a cycloalkyl group or a camphor residue.

3. The positive photoresist composition according to claim 1, which further comprises (C) an organic basic compound and (D) a fluorine-type and/or silicon-type surfactant.

4. The positive photoresist composition according to claim 1, wherein the content of the repeating unit represented by the general formula (I) is 25 to 70 mol %, the content of the repeating unit represented by the general formula (NII) is 2 to 50 mol %, in the total repeating units and the content of the repeating units represented by the general formulae (I-1) to (I-4) is 1 to 30 mol %, in the total repeating units.

5. The positive photoresist composition according to claim 1, wherein the resin (A1) has a weight average molecular weight of from 1,000 to 1,000,000.

6. The positive photoresist compositin according to claim 1, wherein the content of the resin (A1) is from 40 to 99.9% by weight relative to the total solid content in the photoresist composition.

7. The positive photoresist composition according to claim 1, wherein the repeating unit having a group represented by any of general formulae (I-1) to (I-4) is of genera formulae (I-1).

8. The positive photoresist composition according to claim 1, wherein the repeating unit having a group represented by any of general formulae (I-1) to (I-4) is of general formulae (I-2).

9. The positive photoresist composition according to claim 1, wherein the repeating unit having a group represented by any of general formulae (I-1) to (I-4) is of general formulae (I-3).

10. The positive photoresist composition according to claim 1, wherein the repeating unit having a group represented by any of general formulae (I-1) to (I-4) is of general formulae (I-4).

* * * * *